US008884278B2

United States Patent
Yonehara et al.

(10) Patent No.: US 8,884,278 B2
(45) Date of Patent: Nov. 11, 2014

(54) ORGANIC ELECTROLUMINESCENT DEVICE

(71) Applicants: Toshiya Yonehara, Kanagawa-ken (JP); Tomio Ono, Kanagawa-ken (JP); Tomoaki Sawabe, Tokyo (JP); Keiji Sugi, Kanagawa-ken (JP); Daimotsu Kato, Tokyo (JP); Shintaro Enomoto, Kanagawa-ken (JP)

(72) Inventors: Toshiya Yonehara, Kanagawa-ken (JP); Tomio Ono, Kanagawa-ken (JP); Tomoaki Sawabe, Tokyo (JP); Keiji Sugi, Kanagawa-ken (JP); Daimotsu Kato, Tokyo (JP); Shintaro Enomoto, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/729,836

(22) Filed: Dec. 28, 2012

(65) Prior Publication Data

US 2014/0077169 A1 Mar. 20, 2014

(30) Foreign Application Priority Data

Sep. 14, 2012 (JP) ................................. 2012-202791

(51) Int. Cl.
*H01L 51/00* (2006.01)
*H01L 51/52* (2006.01)

(52) U.S. Cl.
CPC ................................. *H01L 51/5275* (2013.01)
USPC ......................................................... 257/40

(58) Field of Classification Search
CPC .... C09K 11/06; C09K 19/00; H01L 51/5262; G09G 2300/0486
USPC ......................................................... 257/40
See application file for complete search history.

(56) References Cited

U.S. PATENT DOCUMENTS

| | | | |
|---|---|---|---|
| 2003/0116719 A1* | 6/2003 | Miyazawa | 250/484.2 |
| 2007/0080370 A1* | 4/2007 | Miyachi et al. | 257/107 |
| 2009/0151787 A1* | 6/2009 | Yoshikawa et al. | 136/261 |
| 2009/0236973 A1* | 9/2009 | Yabe et al. | 313/504 |
| 2012/0229020 A1 | 9/2012 | Yonehara et al. | |

FOREIGN PATENT DOCUMENTS

| | | |
|---|---|---|
| JP | 2000-156536 | 6/2000 |
| JP | 2000-208276 A | 7/2000 |
| JP | 2004-214276 | 7/2004 |
| JP | 2006-073641 A | 3/2006 |
| JP | 2007-084438 A | 4/2007 |
| JP | 2009-277507 A | 11/2009 |
| JP | 2010-187014 A | 8/2010 |
| JP | 2010-533932 A | 10/2010 |
| JP | 2011-165579 A | 8/2011 |

OTHER PUBLICATIONS

U.S. Appl. No. 14/045,133, filed Oct. 3, 2013, Ono, et al.
Sebastian Reineke, et al., "White organic light-emitting diodes with fluorescent tube efficiency", Nature Letters, vol. 459, May 14, 2009, pp. 234-239.
Office Action issued Aug. 1, 2014 in Japanese Patent Application No. 2012-202791 filed Sep. 14, 2012 (with English Translation).

* cited by examiner

*Primary Examiner* — Andy Huynh
*Assistant Examiner* — Sitaramarao S Yechuri
(74) *Attorney, Agent, or Firm* — Oblon, Spivak, McClelland, Maier & Neustadt, L.L.P.

(57) ABSTRACT

According to one embodiment, an organic electroluminescence device includes a first electrode, a second electrode, a first organic layer and a second organic layer. The second electrode includes a metal. The first organic layer is provided between the first electrode and the second electrode. The first organic layer is configured to emit light. The second organic layer is provided between the first organic layer and the second electrode. A refractive index of the second organic layer in a thickness direction for the light is lower than a refractive index of the first organic layer for the light.

18 Claims, 16 Drawing Sheets

ORGANIC ELECTROLUMINESCENT DEVICE

CROSS-REFERENCE TO RELATED APPLICATIONS

This application is based upon and claims the benefit of priority from the prior Japanese Patent Application No. 2012-202791, filed on Sep. 14, 2012; the entire contents of which are incorporated herein by reference.

FIELD

Embodiments described herein relate generally to an organic electroluminescence device.

BACKGROUND

An organic electroluminescence device includes an organic thin film provided between a cathode and an anode. A voltage is applied to these electrodes, and thus the organic thin film receives electrons injected from the cathode and holes injected from the anode. Thereby, the electrons and the holes recombine; and the light emission due to the radiative deactivation of the excitons created by the recombination is utilized.

In the organic electroluminescence device, it is desirable for the light that is emitted from the light emitting layer to be extracted efficiently.

DETAILED DESCRIPTION

Figure 1A:
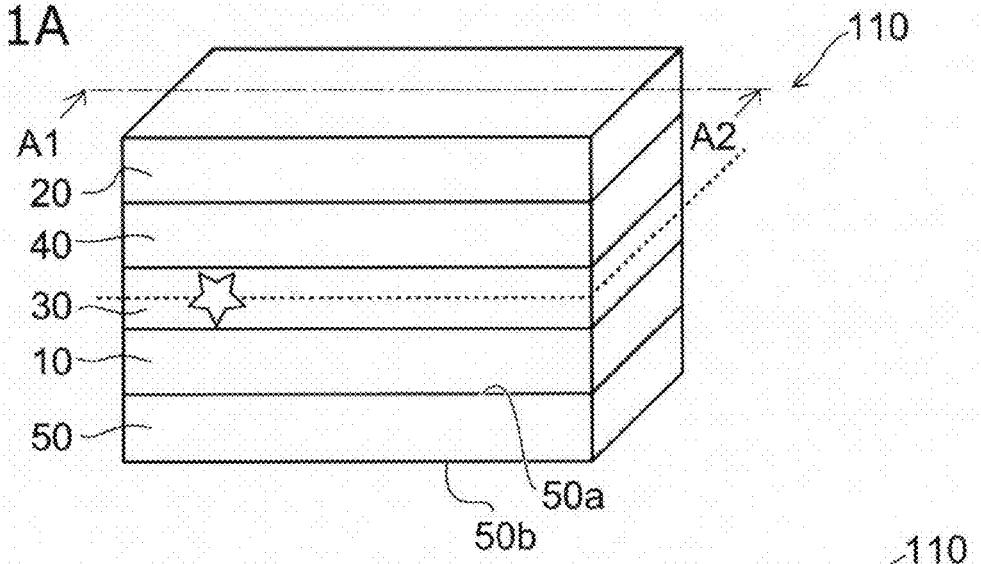
FIG. 1A, FIG. 1B, and FIG. 1C are schematic views showing an organic electroluminescence device according to a first embodiment.

According to one embodiment, an organic electroluminescence device includes a first electrode, a second electrode, a first organic layer and a second organic layer. The second electrode includes a metal. The first organic layer is provided between the first electrode and the second electrode. The first organic layer is configured to emit light. The second organic layer is provided between the first organic layer and the second electrode. A refractive index of the second organic layer in a thickness direction for the light is lower than a refractive index of the first organic layer for the light.

Various embodiments will be described hereinafter based on the accompanying drawings.

The drawings are schematic or conceptual; and the relationships between the thicknesses and the lengths of portions, the proportional coefficients of sizes between portions, etc., are not necessarily the same as the actual values thereof. Further, the dimensions and/or the proportional coefficients may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
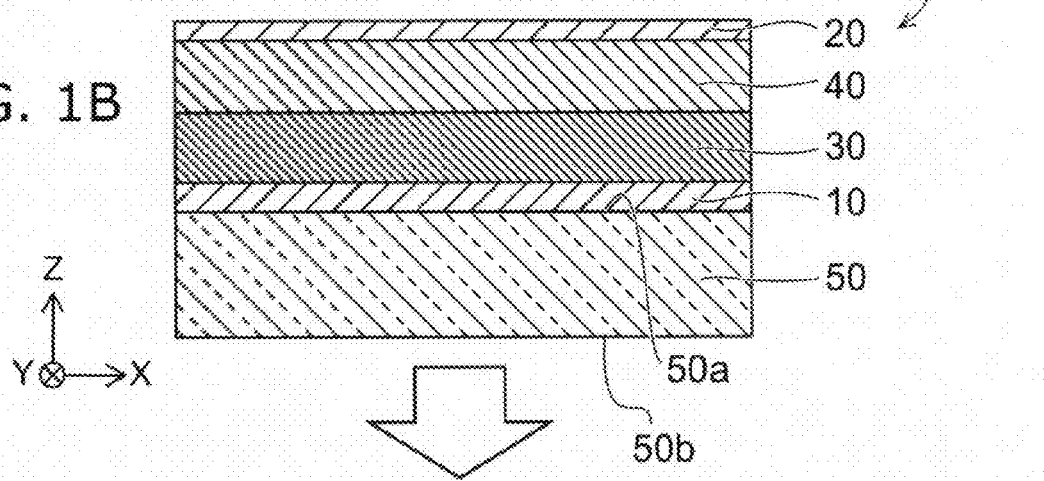
Figure 1C:
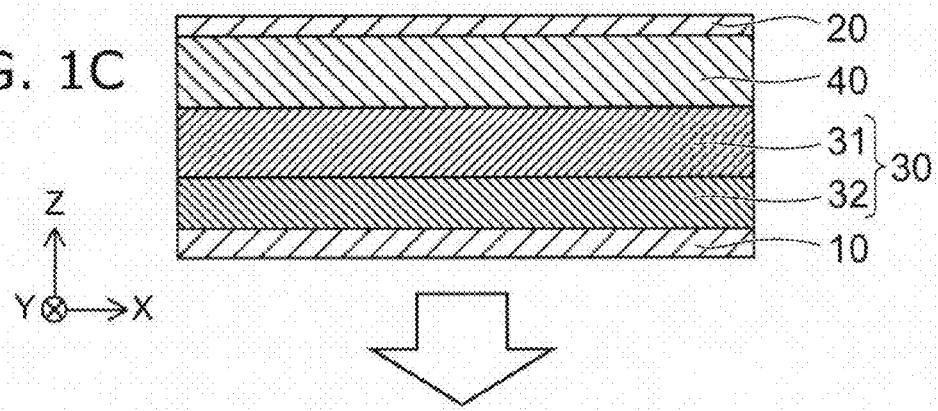

FIG. 1A, FIG. 1B, and FIG. 1C are schematic views showing an organic electroluminescence device according to a first embodiment.

FIG. 1A is a perspective view. FIG. 1B is a sectional view along line A1-A2 of FIG. 1A. FIG. 1C is a schematic sectional view illustrating the partial configuration of the organic electroluminescence device, and corresponds to the sectional view along line A1-A2 of FIG. 1A. Arrows shown in FIG. 1B and FIG. 1C indicate the main light extraction direction.

As shown in FIG. 1A and FIG. 1B, the organic electroluminescence device 110 according to the embodiment includes a first electrode 10, a second electrode 20, a first organic layer 30 that emits light, and a second organic layer 40.

The first electrode 10 is transmissive to the light emitted from the first organic layer 30.

The second electrode 20 includes a metal.

The first organic layer 30 is provided between the first electrode 10 and the second electrode 20. The first organic layer 30 emits the light. For example, the light emitted from the first organic layer 30 is visible light. This light may be ultraviolet light or infrared light.

The second organic layer 40 is provided between the first organic layer 30 and the second electrode 20.

The refractive index ($n_{2e}$) of the second organic layer 40 in the thickness direction for the light is lower than the refractive index ($n_1$) of the first organic layer 30 for the light.

Thereby, the organic electroluminescence device 110 having a high light extraction efficiency is provided.

Here, a direction from the first electrode 10 toward the second electrode 20 is taken as a Z-axis direction (a first direction). For example, a position on the first electrode 10 is a position that is on the first electrode 10 in the Z-axis direction. The Z axis is the first axis. Here, the thickness direction is the direction in which the layers are stacked and is the Z-axis direction. One axis perpendicular to the Z axis is taken as an X axis (a second axis). An axis perpendicular to the Z axis and the X axis is taken as a Y axis (a third axis).

In this example, the organic electroluminescence device 110 includes a substrate 50 that is provided on the side of the first electrode 10 opposite to the second electrode 20. The first electrode 10 is disposed between the substrate 50 and the first organic layer 30. The substrate 50 is transmissive to the light emitted from the first organic layer 30. The substrate 50 has a first surface 50a and a second surface 50b.

For example, the first electrode 10 is provided on the first surface 50a of the substrate 50. The first organic layer 30 is provided on the first electrode 10. The second organic layer 40 is provided on the first organic layer 30. The second electrode 20 is provided on the second organic layer 40.

In the embodiment, for example, the organic electroluminescence device 110 is a bottom-emission type. The intensity of the light emitted from the first organic layer 30 that passes through the first electrode 10 is higher than the intensity of the light emitted from the first organic layer 30 that passes through the second electrode 20. The light emitted from the first organic layer 30 is extracted mainly from the first electrode 10 side (the substrate 50 side).

As shown in FIG. 1C, for example, the first organic layer 30 includes an organic light emitting layer 31 and a first electrode side functional layer 32. The organic light emitting layer 31 is provided between the first electrode 10 and the second organic layer 40. The first electrode side functional layer 32 is provided between the first electrode 10 and the organic light emitting layer 31.

The material of the organic light emitting layer 31 can be made of, for example, Alq$_3$, F8BT, and PPV. The organic light emitting layer 31 can be made of a mixed material of a host material and a dopant added to the host material. For example, CBP, BCP, TPD, PVK, and PPT may be used as the host material. The dopant material can be made of, for example, Flrpic, Ir(ppy)$_3$, Flr6, and Ir(MDQ)$_2$(acac).

The first electrode side functional layer 32 may function, for example, as a hole injection layer. In this case, the first electrode side functional layer 32 can be made of, for example, PEDOT:PPS, CuPc, and MoO$_3$.

The first electrode side functional layer 32 may function, for example, as a hole transport layer. In this case, the first electrode side functional layer 32 includes a hole transport material. The first electrode side functional layer 32 can be made of α-NPD, TAPC, m-MTDATA, TPD, and TCTA.

For example, the first electrode side functional layer 32 may have a stacked structure made of a layer that functions as a hole injection layer and a layer that functions as a hole transport layer.

The second organic layer 40 can include, for example, a layer functioning as an electron transport layer. For example, the second organic layer 40 includes an electron transport material. The material of the layer functioning as the electron transport layer may include, for example, Alq$_3$, BAlq, POPy$_2$, Bpy-OXD, and 3TPYMB.

For example, the second organic layer 40 may have a stacked structure of a layer that functions as an electron transport layer and an electron injection layer provided between the second electrode 20 and the layer that functions as the electron transport layer. The electron injection layer is a layer for improving electron injection characteristics. The thickness of the electron injection layer is, for example, approximately 0.5 nanometers (nm) or more and 1 nanometer (nm) or less.

The second organic layer 40 may include a layer that functions as a hole-blocking layer.

The substrate 50 is, for example, a glass substrate. In this case, the refractive index of glass is selected from, for example, 1.4 or more and 2.2 or less.

The first electrode 10 includes an oxide including at least one element selected from the group consisting of In, Sn, Zn, and Ti. The transparent electrode 10 is, for example, an ITO (Indium Tin Oxide) film. The first electrode 10 functions, for example, as an anode.

The second electrode 20 includes a metal. It is favorable for the second electrode 20 to include the metal as the main component.

For example, the second electrode 20 includes at least one selected from aluminum (Al) and silver (Ag). The second electrode 20 may be made of Mg:Ag (an alloy of magnesium and silver). For example, the second electrode 20 is made of an aluminum film. When the second electrode 20 is made of the aluminum film it gives particularly and advantage to productivity and cost. The second electrode 20 functions, for example, as a cathode. The thickness of the second electrode 20 is, for example, not less than 50 nm.

Characteristics of the organic electroluminescence device 110 will now be described in comparison to a reference example.

Figure 2:
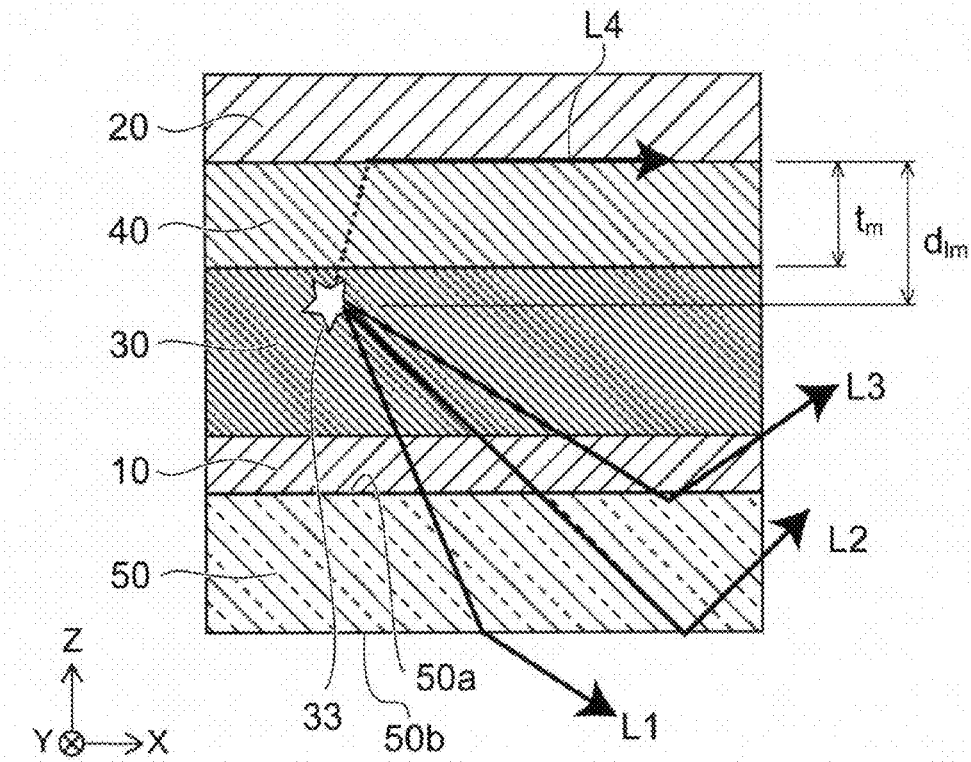
FIG. 2 is a graph showing the organic electroluminescence device and paths of the emitted light.

FIG. 2 is a graph showing the organic electroluminescence device and paths of the emitted light.

In the organic electroluminescence device as shown in FIG. 2, the destinations of the light produced by a light source 33 inside the first organic layer 30 are largely classified into four components. In the organic electroluminescence device, the light includes an external mode component L1, a substrate mode component L2, a thin film layer mode component L3, and a loss component L4 due to the second electrode 20 which includes the metal. Herein, the loss component L4 due to the second electrode 20 which includes the metal is called simply the loss component L4.

The external mode component L1 is a component extractable outside the organic electroluminescence device. The substrate mode component L2 is a component that reaches the substrate 50 but undergoes a total reflection at the second surface 50b of the substrate 50. The substrate mode component L2 is extracted from the X-axis direction end portion of the substrate 50 or the Y-axis direction end portion of the substrate 50. For example, in the case where an optical path conversion unit (the optical path conversion unit 54 described below) is provided on the second surface 50b side of the substrate 50, the substrate mode component L2 is extracted to the outside.

The thin film layer mode component L3 is a component that reaches the first electrode 10 but undergoes a total reflection at the first surface 50a of the substrate 50. The thin film layer mode component L3 is extracted from the X-axis direction end portion of the first electrode 10 or the Y-axis direction end portion of the first electrode 10. For example, in the case where the optical path conversion unit (the optical path conversion unit 54 described below) is provided on the first surface 50a side of the substrate 50, the thin film layer mode component L3 is extracted to the outside. The thin film layer mode L3 is extracted from the X-axis direction end portion or the Y-axis direction end portion, and attenuated due to the absorption in the device.

Thus, the substrate mode component L2 and the thin film layer mode component L3 are components for which there is a possibility of being extracted to the outside.

Conversely, the loss component L4 is a component having a loss due to the second electrode 20 which includes the metal.

Here, the light that enters the second organic layer 40 from the first organic layer 30 includes propagating light emitted from the first organic layer 30 and non-propagating light.

The propagating light is light being able to propagate to infinity within the medium with no absorption.

The non-propagating light is light having intensity decreasing exponentially with a propagation distance.

The loss component L4 includes the loss of the propagating light and the loss of the non-propagating light.

The loss of the propagating light (hereinbelow, the propagating light loss) is the loss due to being absorbed by the second electrode 20. The propagating light loss does not depend on the distance between the second electrode 20 and the first organic layer 30 which is the light source.

The loss of the non-propagating light (hereinbelow, the non-propagating light loss) occurs due to an interaction between the evanescent light and the electrons inside the metal of the second electrode 20. This interaction is called plasmon loss. The non-propagating light loss depends on the distance between the light source 33 (dipole) and the second electrode 20, and thus results in depending on the distance (a thickness $d_{lm}$ of the second organic layer 40 described below) between the second electrode 20 and the first organic layer 30 the light source.

Figure 3:
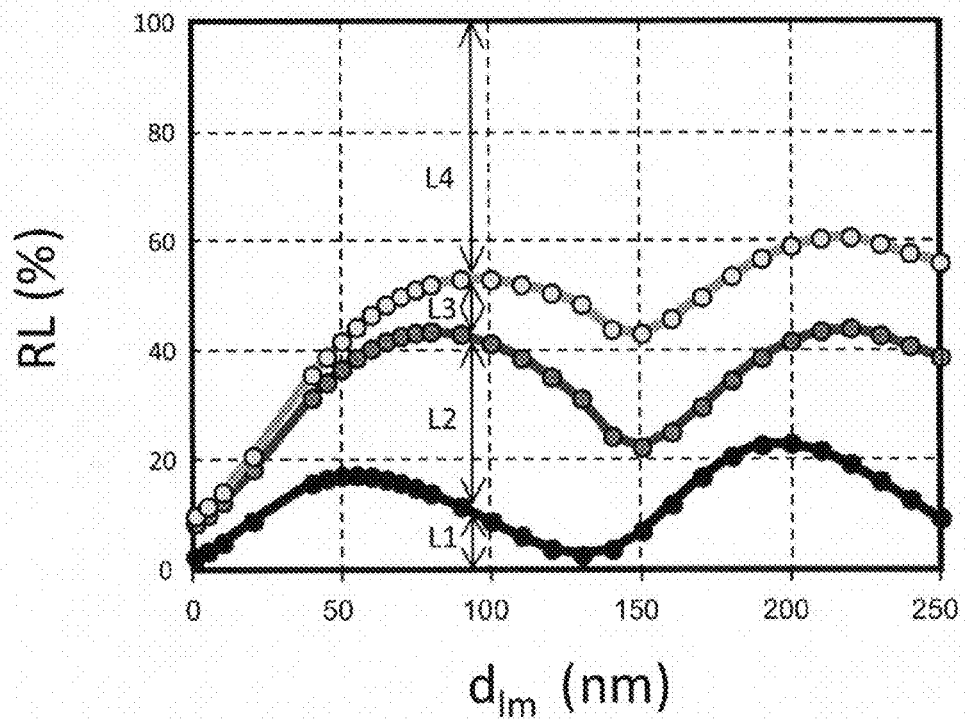
FIG. 3 is a graph showing characteristics of the organic electroluminescence device according to the first embodiment.

FIG. 3 is a graph illustrating characteristics of the organic electroluminescence device.

FIG. 3 shows an example of simulation results of a distribution ratio RL of the light energy. The horizontal axis of FIG. 3 represents a distance $d_{lm}$ to the second electrode 20 from the first organic layer 30 which is the light source. The vertical axis of FIG. 3 represents the distribution ratio RL.

This simulation uses a model of the organic electroluminescence device having the following configuration.

The substrate 50 is a glass substrate, and the refractive index is 1.5. The first electrode 10 is made of ITO, the film thickness is 110 nm, and the refractive index is 1.9. The film thickness of the first organic layer 30 is 80 nm, and the refractive index is 1.9. The refractive index of the second organic layer 40 is 1.9. The second electrode 20 is made of aluminum, and the film thickness is 150 nm. The light emitting position is at a position in the first organic layer 30 close to an interface between the second organic layer 40 and the first organic layer 30.

As shown in FIG. 3, for example, the external mode component L1, the substrate mode component L2, the thin film layer mode component L3, and the loss component L4 change with the distance $d_{lm}$ to the second electrode 20 from the first organic layer 30. The light emitting position is at the position in the first organic layer 30 close to an interface between the second organic layer 40 and the first organic layer 30, and thus the distance $d_{lm}$ represents substantially the distance from the light source 33 (dipole) to the second electrode 20.

To increase the light extraction efficiency of the organic electroluminescence device, a configuration may be considered to reduce the loss component L4 by reducing the non-propagating light loss recited above.

The level of the non-propagating light loss at the second electrode 20 is a level that can be ignored when the distance $d_{lm}$ from the light source 33 to the second electrode 20 is not less than the attenuation distance $d_c$. It is known that in the conditions of the simulation recited above, the attenuation distance $d_c$ is 200 nanometers (nm) (Nature, Vol 459, 234 (2009)). For example, in the case where the second electrode 20 is the cathode, it may be considered to make the thickness of the electron transport layer that contacts the cathode to be not less than the attenuation distance $d_c$.

As shown in FIG. 3, the loss component L4 decreases in the region where the distance $d_{lm}$ from the light source 33 to the second electrode 20 is not less than 200 nm. In other words, the loss component L4 decreases in the region where the distance $d_{lm}$ from the light source 33 to the second electrode 20 is not less than the attenuation distance $d_c$.

However, in the case where the film thickness of the electron transport layer is thick, there is a possibility that a large voltage drop may occur at the electron transport layer. As a result, in this configuration, the driving voltage of the organic electroluminescence device increases. In other words, although the external quantum efficiency of the organic electroluminescence device is increased by this configuration, the electrical power efficiency decreases. Therefore, in this configuration, it is difficult to obtain a practical performance. In order to suppress the voltage drop, there is a method in which the transport capability of the charge of the electron transport layer is improved by doping the electron transport layer with an alkaline metal, etc. Thereby, it may be considered that the increase of the driving voltage is suppressed and the decrease of the electrical power efficiency is somewhat recovered. However, it is difficult to practically employ the doping with the alkaline metal, etc., from the viewpoint of productivity and cost. Since the alkaline metal is chemically highly reactive, it is difficult to handle.

Moreover, increasing the thickness of the electron transport layer leads to an increased amount of the materials to be used and a longer tact time in manufacturing. In other words, from these viewpoints as well, there is a possibility that the productivity may decrease.

On the contrary, in the embodiment as described below, the light extraction efficiency of the substrate mode component L2 that can be extracted to the outside can be increased without increasing the thickness $t_m$ of the second organic layer 40 by at least the refractive index $n_{2e}$ of the second organic layer 40 in the thickness direction being lower than the refractive index $n_1$ of the first organic layer 30. Accordingly, the thickness $t_m$ of the second organic layer 40 may be the attenuation distance $d_c$ or less.

In the embodiment, the light extraction efficiency increases even in the case where the thickness $t_m$ of the second organic layer 40 is not more than the attenuation distance $d_c$. Also, in the embodiment, the decrease of the electrical power efficiency caused by the voltage drop is suppressed. In the embodiment, high productivity is maintained.

It is favorable for the thickness $t_m$ of the second organic layer 40 to be not more than the critical distance $d_c$. For example, because the critical distance $d_c$ is about 200 nm, it is favorable for the thickness $t_m$ of the second organic layer 40 to be not less than 1 nanometer and not more than 200 nanometers.

In the embodiment, since it is unnecessary to increase the thickness of the second organic layer 40, the driving voltage increase associated with the film thickness increase does not occur. Therefore, alkaline metal doping into the second organic layer 40 is unnecessary.

Figure 4:
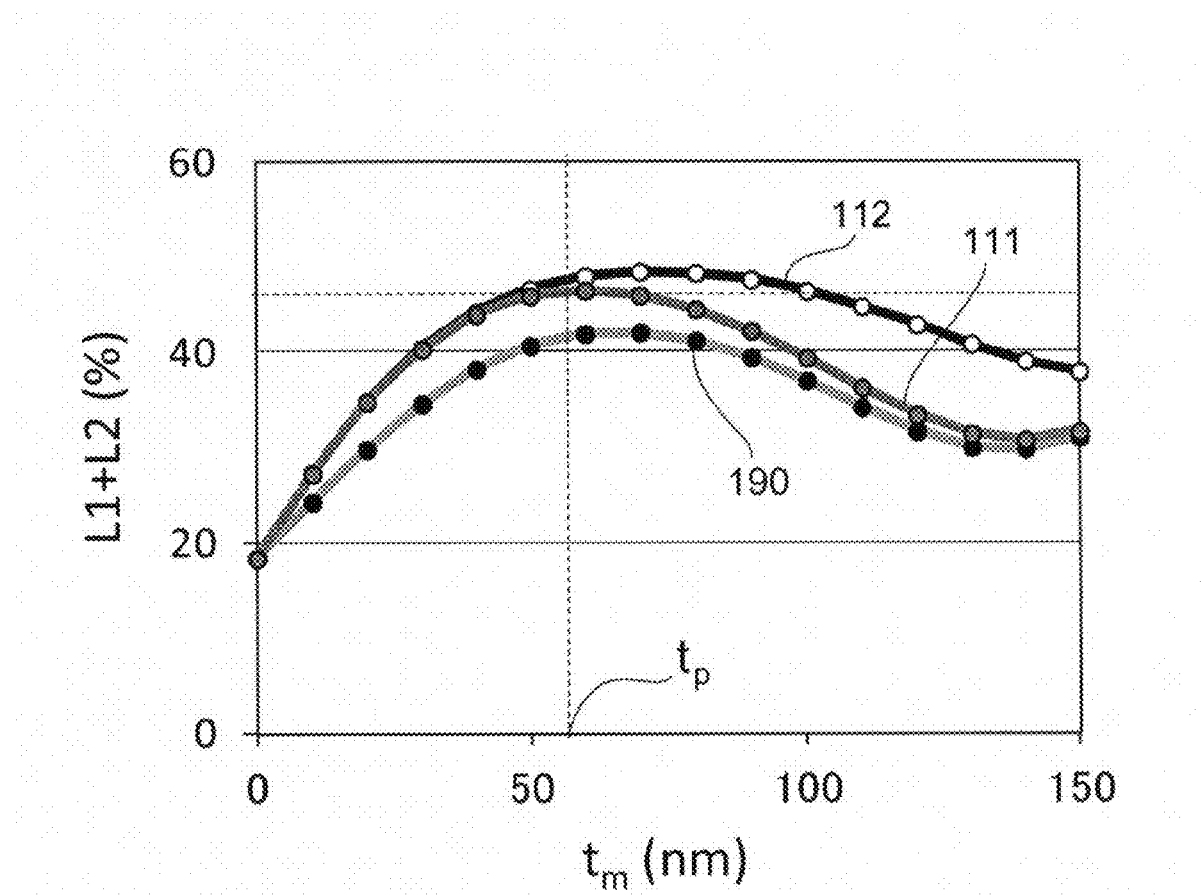
FIG. 4 is a graph showing characteristics of organic electroluminescence devices according to the first embodiment.

FIG. 4 is a graph showing characteristics of organic electroluminescence devices according to the first embodiment.

The horizontal axis of FIG. 4 represents the thickness $t_m$ (having units of nm) of the second organic layer 40. The vertical axis of FIG. 4 represents the sum of the external mode component L1 and the substrate mode component L2 (L1+

L2)(%) of the organic electroluminescence device at the wavelength 525 nm of the light emitted from the first organic layer 30.

FIG. 4 shows the characteristics of an organic electroluminescence device 190 of a reference example, an organic electroluminescence device 111 of a first specific example of the embodiment, and an organic electroluminescence device 112 of a second specific example of the embodiment.

In the organic electroluminescence device 190, a refractive index $n_2$ of the second organic layer 40 is isotropic. In the organic electroluminescence device 190, the refractive index $n_{2e}$ of the second organic layer 40 in the thickness direction is equal to a refractive index $n_{2o}$ of the second organic layer 40 in a direction perpendicular to the thickness direction. In the organic electroluminescence device 190, the refractive index $n_2(=n_{2e}=n_{2o})$ of the second organic layer 40 is equal to the refractive index $n_1$ of the first organic layer 30.

In the organic electroluminescence device 111, the refractive index of the second organic layer 40 is anisotropic. In the organic electroluminescence device 111, the refractive index $n_{2e}$ of the second organic layer 40 in the thickness direction (the Z-axis direction) is lower than the refractive index $n_{2o}$ of the second organic layer 40 in directions (the X and Y-axis directions) perpendicular to the thickness direction. In the organic electroluminescence device 111, the refractive index $n_{2e}$ of the second organic layer 40 in the thickness direction is lower than the refractive index $n_1$ of the first organic layer 30. The refractive index $n_{2o}$ of the second organic layer 40 in directions perpendicular to the thickness direction is equal to the refractive index $n_1$ of the first organic layer 30.

In the organic electroluminescence device 112, the refractive index $n_2$ of the second organic layer 40 is isotropic. In the organic electroluminescence device 112, the refractive index $n_{2e}$ of the second organic layer 40 in the thickness direction (the Z-axis direction) is equal to the refractive index $n_{2o}$ of the second organic layer 40 in the directions (the X and Y-axis directions) perpendicular to the thickness direction. In the organic electroluminescence device 112, the refractive index $n_2(=n_{2e}=n_{2o})$ of the second organic layer 40 is lower than the refractive index $n_1$ of the first organic layer 30.

As shown in FIG. 4, the sum of the external mode component L1 and the substrate mode component L2 (L1+L2) of the organic electroluminescence devices 111 and 112 is higher than the sum of the external mode component L1 and the substrate mode component L2 (L1+L2) of the organic electroluminescence device 190 regardless of the thickness $t_m$ of the second organic layer 40. This trend is realized for the range in which the thickness $t_m$ of the second organic layer 40 is not more than the attenuation distance $d_c$. It may be considered that the increase of the sum of the external mode component L1 and the substrate mode component L2 (L1+L2) means the decrease of the loss component L4.

From the results recited above, at least the refractive index $n_{2e}$ of the second organic layer 40 in the thickness direction for the peak wavelength of the light emitted from the first organic layer 30 is lower than the refractive index $n_1$ of the first organic layer 30. It is favorable for the refractive index $n_{2e}$ of the second organic layer 40 in the thickness direction to be lower than the refractive index of the first organic layer 30 in the thickness direction and lower than the refractive index of the first organic layer 30 in the directions perpendicular to the thickness direction in the organic electroluminescence devices 111 and 112. Not only the refractive index $n_{2e}$ of the second organic layer 40 in the thickness direction but also the refractive index $n_{2o}$ of the second organic layer 40 in the directions perpendicular to the thickness direction may be lower than the refractive index $n_1$ of the first organic layer 30. Thereby, the sum of the external mode component L1 and the substrate mode component L2 (L1+L2) increases, and the light extraction efficiency that can be extracted to the outside increases.

For example, as in the organic electroluminescence device 111, the refractive index $n_{2e}$ of the second organic layer 40 in the thickness direction is lower than the refractive index $n_{2o}$ of the second organic layer 40 in the directions perpendicular to the thickness direction. In other words, the refractive index $n_2$ of the second organic layer 40 has a negative uniaxial property. Thereby, regardless of whether the refractive index $n_2$ of the second organic layer 40 is isotropic or anisotropic, various materials can be selected for the second organic layer 40.

For example, in the case where the light emitted from the first organic layer 30 has a first wavelength band that is not less than 400 nm and not more than 800 nm, the relationship between the refractive indexes recited above may be realized in the first wavelength band. In other words, at least the refractive index $n_{2e}$ of the second organic layer 40 in the thickness direction for the first wavelength band is lower than the refractive index $n_1$ of the first organic layer 30 for the first wavelength band. The light extraction efficiency of the organic electroluminescence device that emits visible light increases.

Figure 5A:
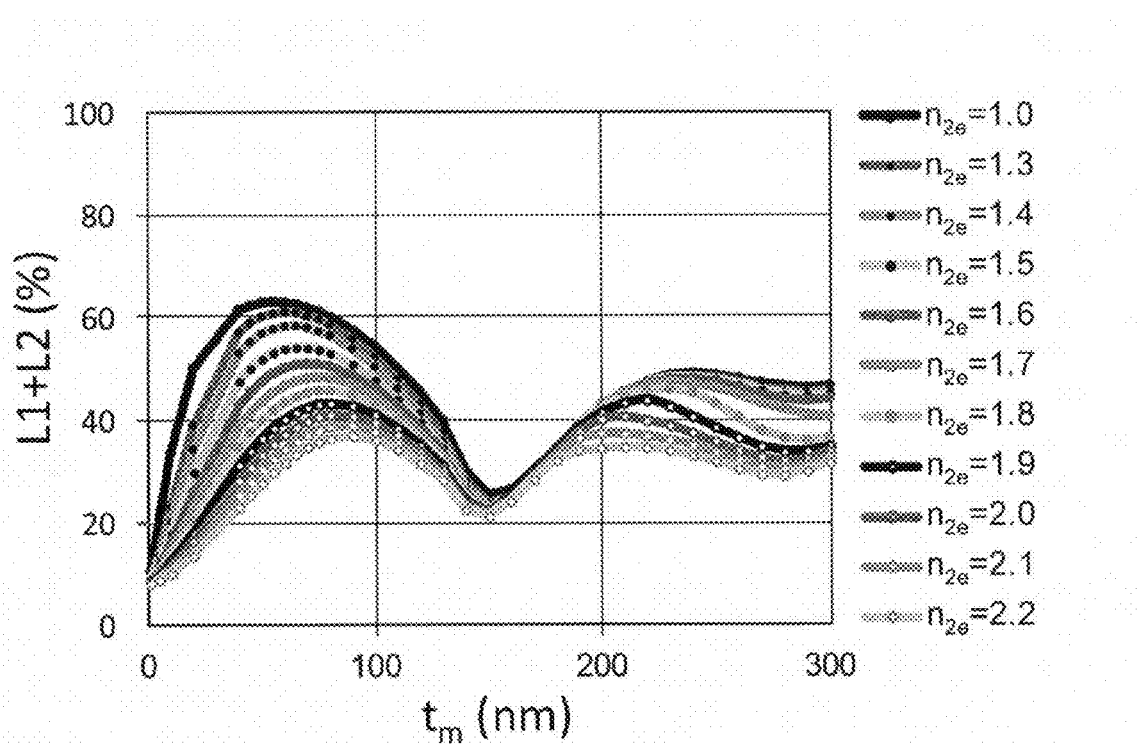
FIG. 5A and FIG. 5B are graphs showing characteristics of the organic electroluminescence device according to the first embodiment.
Figure 5B:
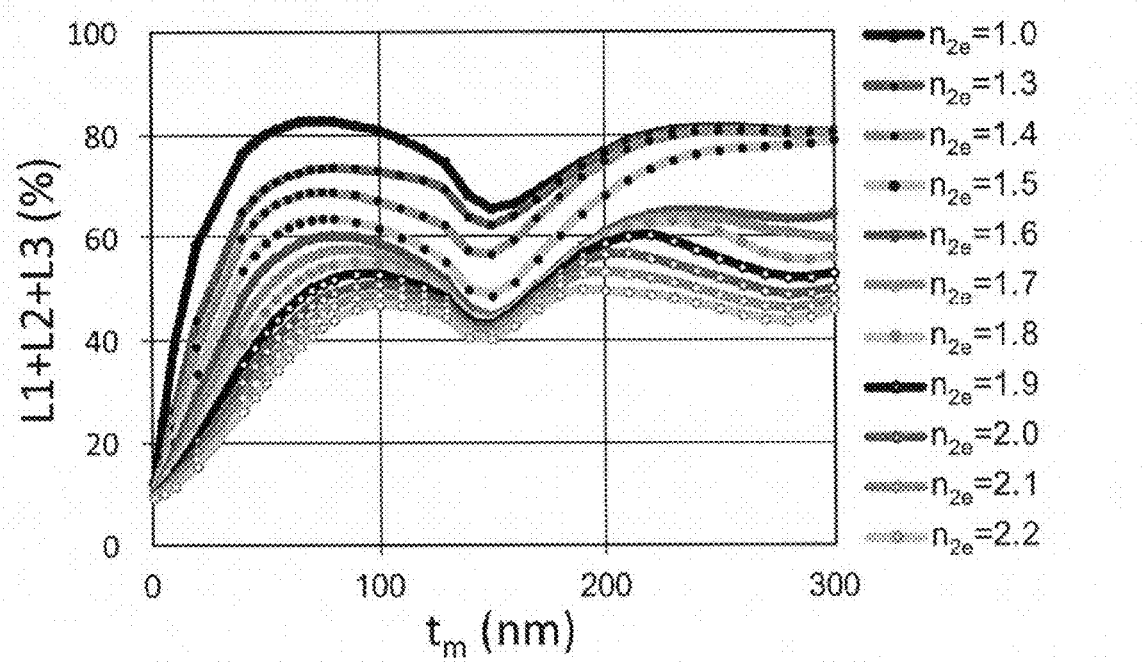

FIG. 5A and FIG. 5B are graphs showing characteristics of the organic electroluminescence device according to the first embodiment.

FIG. 5A and FIG. 5B show the case where the refractive index $n_{2o}$ of the second organic layer 40 in the directions perpendicular to the thickness direction is equal to the refractive index $n_1$ of the first organic layer 30, and the refractive index $n_{2e}$ of the second organic layer 40 in the thickness direction is different from the refractive index $n_1$ of the first organic layer 30.

In FIG. 5A and FIG. 5B, the horizontal axis represents the thickness $t_m$ (having units of nm) of the second organic layer 40.

The vertical axis of FIG. 5A represents the sum of the external mode component L1 and the substrate mode component L2 (L1+L2) (%) of the organic electroluminescence device 110 at the wavelength 525 nm of the light emitted from the first organic layer 30.

The vertical axis of FIG. 5B represents the sum of the external mode component L1, the substrate mode component L2, and the thin film layer mode component L3 (L1+L2+L3) (%) of the organic electroluminescence device 110 at the wavelength 525 nm of the light emitted from the first organic layer 30.

As an example, the organic electroluminescence device 110 having the following configuration is used as the model for the characteristics shown in FIG. 5A and FIG. 5B. The substrate 50 is a glass substrate. The refractive index of the substrate 50 is 1.5. The first electrode 10 is ITO. The refractive index of the first electrode 10 is 1.9. The thickness of the first electrode 10 is 110 nm. The refractive index $n_1$ of the first organic layer 30 is 1.9. The thickness of the first organic layer 30 is 80 nm. As described above, the refractive index $n_{2o}$ of the second organic layer 40 in the directions perpendicular to the thickness direction is equal to the refractive index $n_1$ of the first organic layer 30 and is 1.9. The second electrode 20 is Al.

FIG. 5A and FIG. 5B show a trend in which the sum of the external mode component L1 and the substrate mode component L2 (L1+L2), and the sum of the external mode component L1, the substrate mode component L2, and the thin film layer mode component L3 (L1+L2+L3) increase as at least the refractive index $n_{2e}$ of the second organic layer 40 in the thickness direction decreases in the case of the thickness $t_m$ of the second organic layer 40 being constant value.

It may be considered that the increase of the light extraction efficiency for the substrate mode component L2 and the thin film layer mode component L3 means the decrease of the loss component L4. The cause of plasmon loss is interaction between a light source (dipole) and electrons in a metal. In the embodiment, the interaction between the light source and the metal is weakened by rapidly induced attenuation of the non-propagating light. As a result, the emission ratio of energy of the light source to the non-propagating light component decreases, and the emission ratio to the propagating light increases relatively.

Figure 6A:
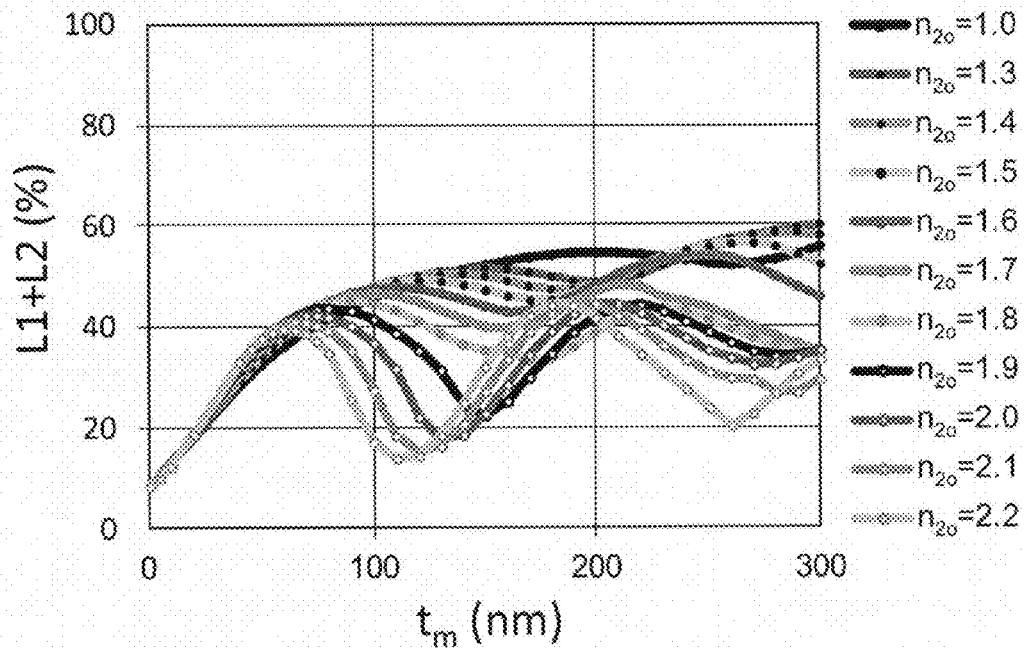
FIG. 6A and FIG. 6B are graphs showing characteristics of the organic electroluminescence device according to the first embodiment.
Figure 6B:
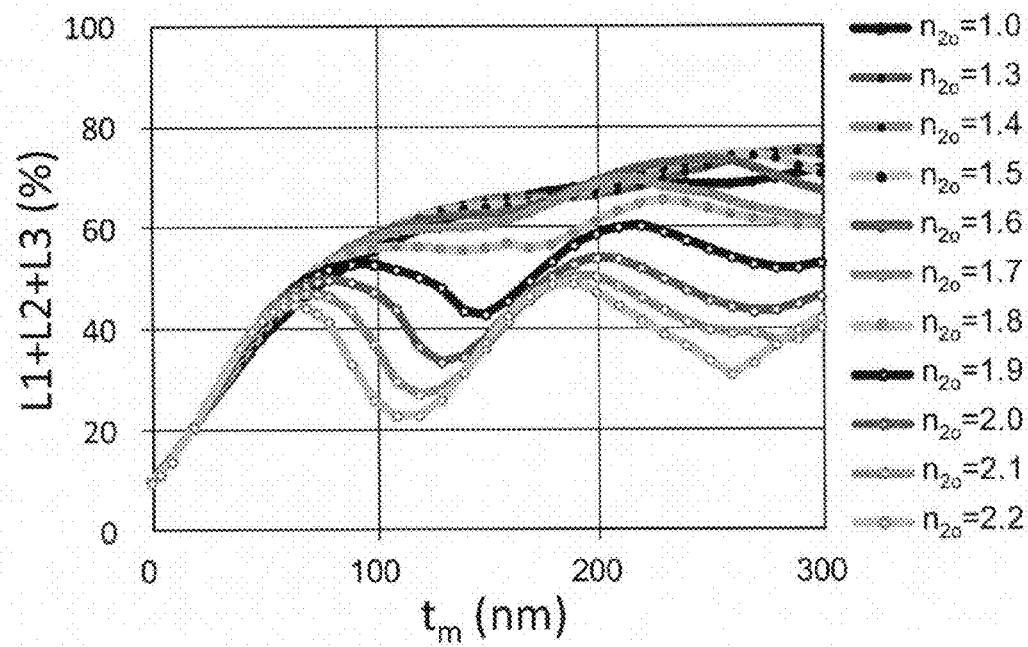

FIG. 6A and FIG. 6B are graphs showing characteristics of the organic electroluminescence device according to the first embodiment.

Contrary to FIG. 5A and FIG. 5B, FIG. 6A and FIG. 6B show the case where the refractive index $n_{2e}$ of the second organic layer 40 in the thickness direction is equal to the refractive index $n_1$ of the first organic layer 30, and the refractive index $n_{2o}$ of the second organic layer 40 in the directions perpendicular to the thickness direction is different from the refractive index $n_1$ of the first organic layer 30.

In FIG. 6A and FIG. 6B, the horizontal axis represents the thickness (having units of nm) of the second organic layer 40.

The vertical axis of FIG. 6A represents the sum of the external mode component L1 and the substrate mode component L2 (L1+L2) (%) of the organic electroluminescence device 110 at the wavelength 525 nm of the light emitted from the first organic layer 30.

The vertical axis of FIG. 6B represents the sum of the external mode component L1, the substrate mode component L2, and the thin film layer mode component L3 (L1+L2+L3) (%) of the organic electroluminescence device 110 at the wavelength 525 nm of the light emitted from the first organic layer 30.

The configuration of the model for the characteristics shown in FIG. 6A and FIG. 6B differs from the configuration of the model for the characteristics shown in FIG. 5A and FIG. 5B for the following aspects. The refractive index $n_{2e}$ of the second organic layer 40 in the thickness direction is equal to the refractive index $n_1$ of the first organic layer 30 and is 1.9.

As shown in FIG. 6A and FIG. 6B, in the case where the refractive index $n_{2e}$ of the second organic layer 40 in the thickness direction is equal to the refractive index $n_1$ of the first organic layer 30, the light extraction efficiency of the substrate mode component L2 and the light extraction efficiency of the thin film layer mode component L3 change with the refractive index $n_{2o}$ of the second organic layer 40 in the directions perpendicular to the thickness direction. However, even in the case where the refractive index $n_{2o}$ of the second organic layer 40 in the directions perpendicular to the thickness direction is low, there is no trend in which the sum of the external mode component L1 and the substrate mode component L2 (L1+L2) and the sum of the external mode component L1, the substrate mode component L2, and the thin film layer mode component L3 (L1+L2+L3) increase due to the refractive index $n_{2o}$ of the second organic layer 40 in the directions perpendicular to the thickness direction.

It can be seen from the results of FIG. 5A to FIG. 6B that it is favorable for at least the refractive index $n_{2e}$ of the second organic layer 40 in the thickness direction to be lower than the refractive index $n_1$ of the first organic layer 30. Thereby, the sum of the external mode component L1 and the substrate mode component L2 (L1+L2) and the sum of the external mode component L1, the substrate mode component L2, and the thin film layer mode component L3 (L1+L2+L3) that can be extracted to the outside increase regardless of the thickness $t_m$ of the second organic layer 40. For example, it is sufficient for the thickness $t_m$ of the second organic layer 40 to be thin in order to decrease the driving voltage. If the thickness $t_m$ of the second organic layer 40 is set to a certain value in order to lower the voltage as the design of the second organic layer 40, and the refractive index $n_{2e}$ of the second organic layer 40 is lowered at the thickness $t_m$, further improvement of the light extraction efficiency is achieved.

Here, in the case where the refractive index of the second organic layer 40 is anisotropic and the refractive index $n_{2e}$ of the second organic layer 40 in the thickness direction is lower than the refractive index $n_{2o}$ of the second organic layer 40 in the directions perpendicular to the thickness direction, it is favorable for the thickness $t_m$ of the second organic layer 40 to be not more than a thickness $t_p$ at which the sum of the external mode component L1 and the substrate mode component L2 (L1+L2) and the sum of the external mode component L1, the substrate mode component L2, and the thin film layer mode component L3 (L1+L2+L3) are maximums.

This is because the light extraction efficiency that is obtained is equivalent to that of the case (the organic electroluminescence device 112) where the refractive index $n_2$ of the second organic layer 40 is isotropic even in the case (the organic electroluminescence device 111) where the refractive index $n_2$ of the second organic layer 40 is anisotropic as shown in FIG. 4.

For example, materials such as Bpy-OXD and BSB-Cz may be used as the second organic layer 40 in the case where the refractive index $n_{2e}$ of the second organic layer 40 in the thickness direction is lower than the refractive index $n_{2o}$ of the second organic layer 40 in the directions perpendicular to the thickness direction.

Figure 7:
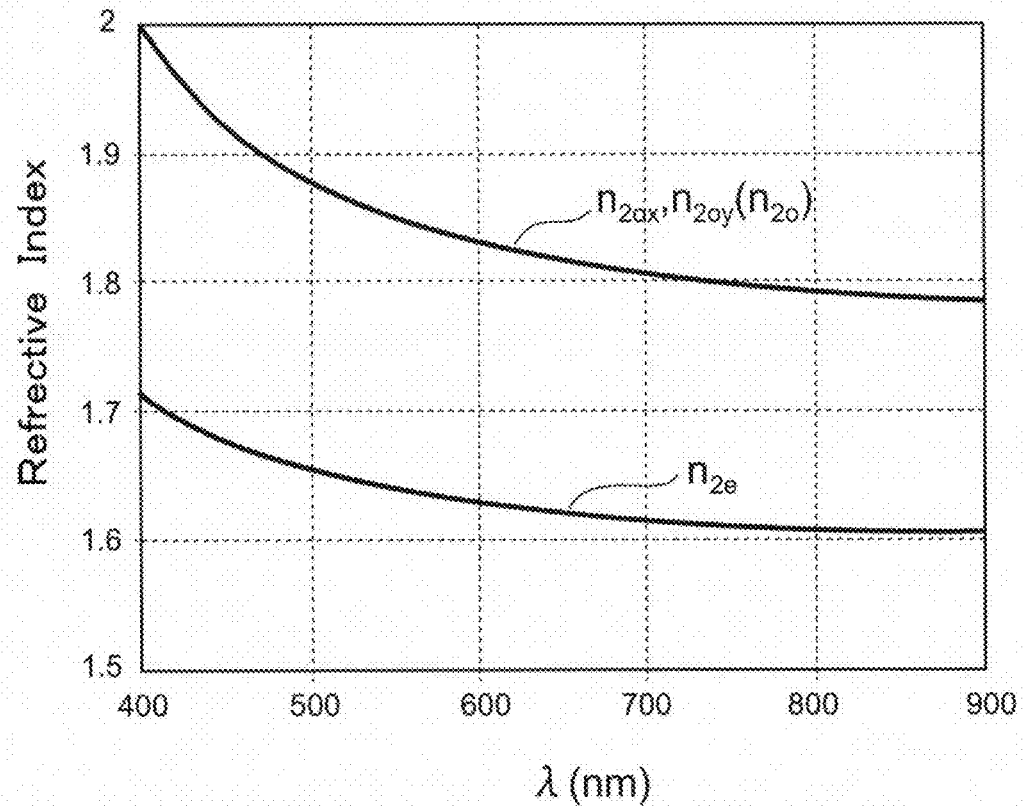
FIG. 7 is a graph showing characteristics of the second organic layer.

FIG. 7 is a graph showing characteristics of the second organic layer.

FIG. 7 shows the refractive index of the second organic layer 40 by wavelength.

The horizontal axis of FIG. 7 represents the wavelength λ (having units of nm) of the light. The vertical axis of FIG. 7 represents the refractive index.

As shown in FIG. 7, the refractive index $n_{2e}$ of the second organic layer 40 in the thickness direction is lower than the refractive index $n_{2o}$ of the second organic layer 40 in the directions perpendicular to the thickness direction. In this example, a refractive index $n_{2ox}$ of the second organic layer 40 in the X direction is equal to a refractive index $n_{2oy}$ of the second organic layer 40 in the Y direction. The refractive index $n_{2e}$ of the second organic layer 40 in the thickness direction is lower than the refractive index $n_{2ox}$ of the second organic layer 40 in the X direction and lower than the refractive index $n_{2oy}$ of the second organic layer 40 in the Y direction.

The refractive index $n_{2ox}$ of the second organic layer 40 in the X direction may be different from the refractive index $n_{2oy}$ of the second organic layer 40 in the Y direction.

Figure 8:
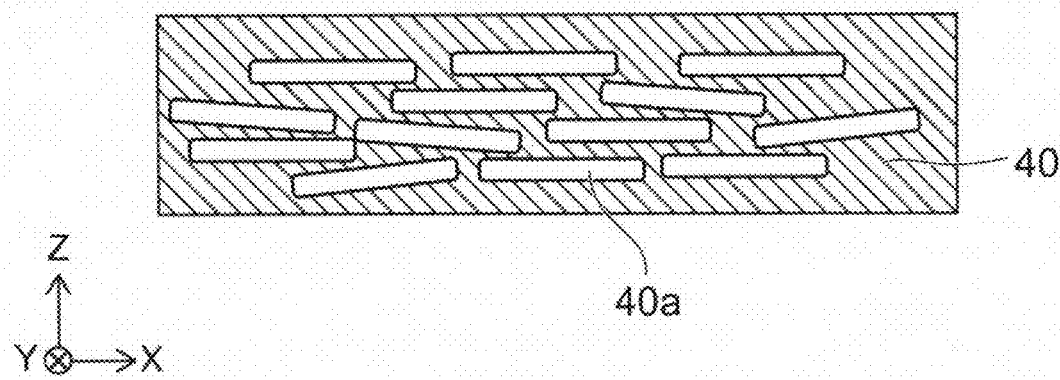
FIG. 8 is a schematic sectional view showing the second organic layer.

FIG. 8 is a schematic sectional view showing the second organic layer 40.

As shown in FIG. 8, for example, the second organic layer 40 includes a second organic layer material 40a. The length of the second organic layer material 40a in the first direction is shorter than the length of the second organic layer material 40a in a second direction that is orthogonal to the first direction. The axis (the long axis) of the second organic layer material 40a in the second direction is parallel to the first surface 50a of the substrate 50. The intermolecular distance of the multiple second organic layer materials 40a in the first direction is shorter than in the case where the long axis is not parallel to the first surface 50a. Thereby, there is a possibility that the carrier mobility of the second organic layer 40 in the thickness direction may increase and the second organic layer 40 may have anisotropy of the refractive index such that the refractive index $n_{2e}$ in the thickness direction is different from the refractive index $n_{2o}$ in the direction perpendicular to the thickness direction. For example, the molecular structure of the second organic layer material 40a has a plate configuration or a rod configuration. For example, such a second organic layer 40 is formed by spin coating. Thus, the refractive index of the second organic layer 40 may be anisotropic; and the materials such as those recited above may be used as the second organic layer material 40a.

Thus, according to the embodiment, the refractive index $n_{2e}$ of the second organic layer 40 in the thickness direction is lower than the refractive index $n_1$ of the first organic layer 30. Thereby, various materials can be selected as the second organic layer 40 regardless of whether the refractive index n2 of the second organic layer 40 is isotropic or anisotropic.

A modification of the first embodiment will now be described.

Figure 9:
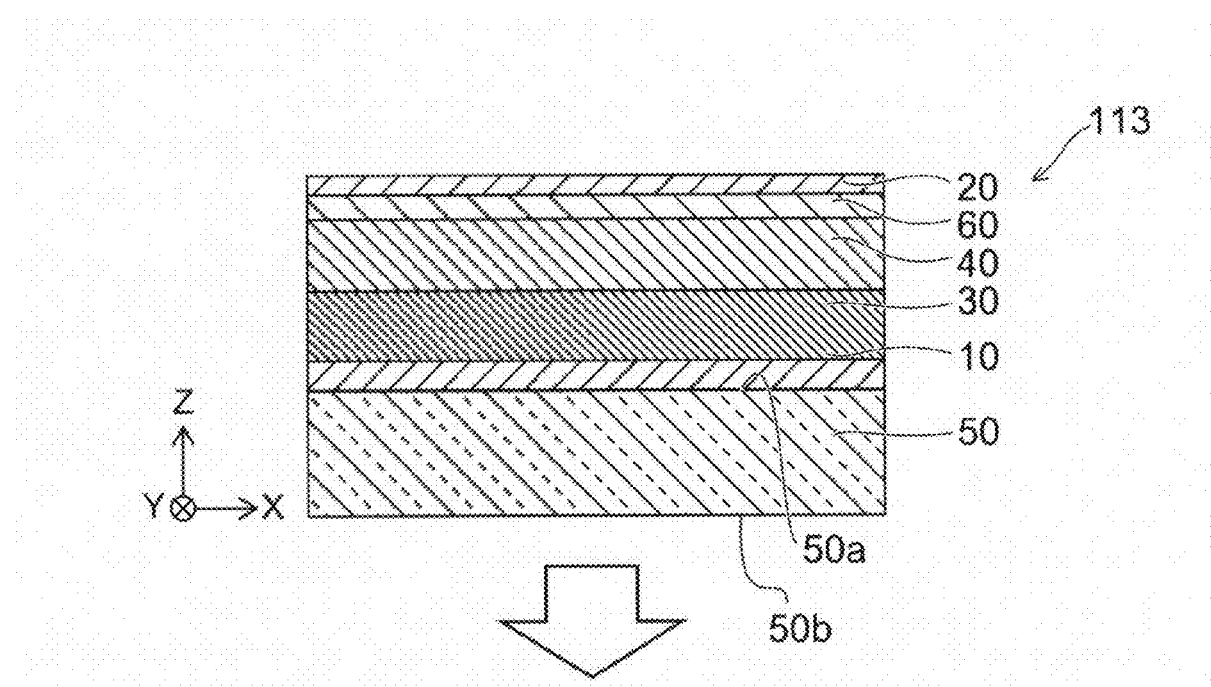
FIG. 9 is a schematic sectional view showing an organic electroluminescence device according to a first modification of the first embodiment.

FIG. 9 is a schematic sectional view showing an organic electroluminescence device according to a first modification of the first embodiment. The arrow shown in FIG. 9 indicates the main light extraction direction.

As shown in FIG. 9, the organic electroluminescence device 113 differs from the organic electroluminescence device 110 in that the organic electroluminescence device 113 further includes a third functional layer 60. The aspects of the organic electroluminescence device 113 that differ from those of the organic electroluminescence device 110 will now be described.

The third functional layer 60 is provided between the second organic layer 40 and the second electrode 20. The third functional layer 60 includes a material that is different from the material of the second organic layer 40. For example, a material having an electron transport capability that is higher than that of the second organic layer 40 is used as the third functional layer 60. For example, in the case where the second organic layer 40 is a layer that functions as a hole-blocking layer, the third functional layer 60 includes an electron transport material.

Figure 10A:
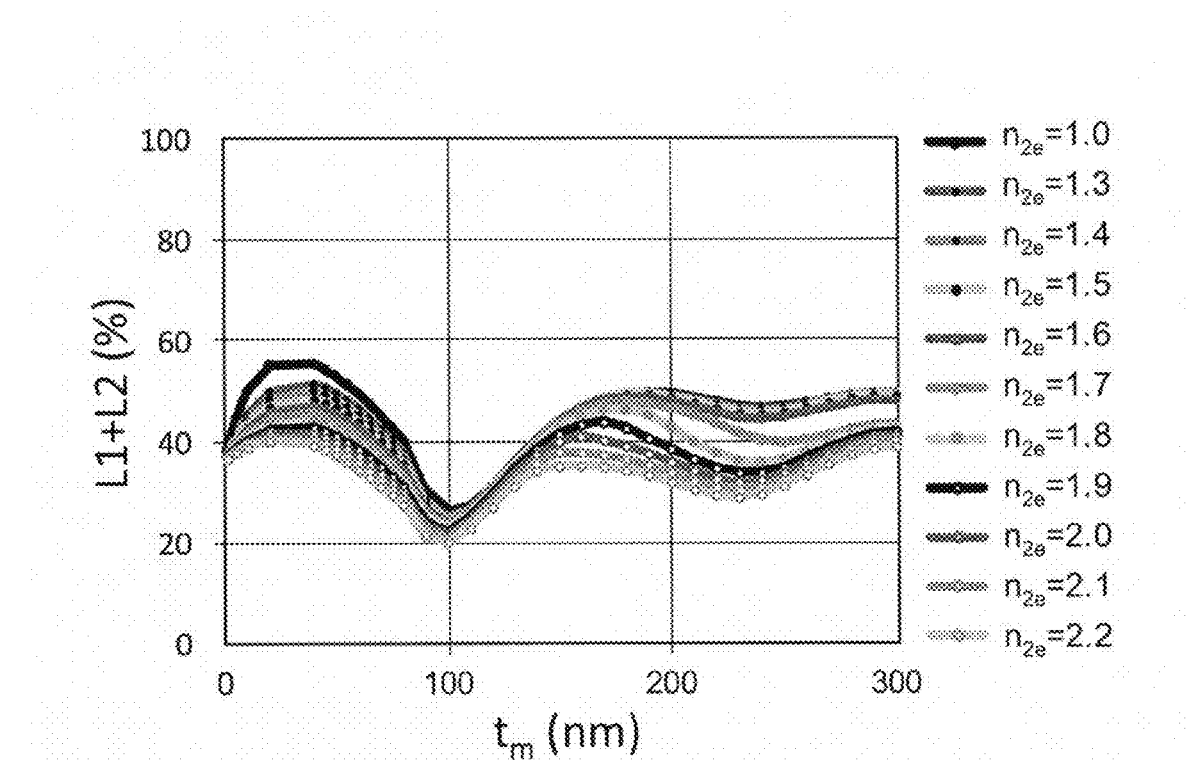
FIGS. 10A and 10B are graphs showing characteristics of the organic electroluminescence device according to the first modification of the first embodiment.
Figure 10B:
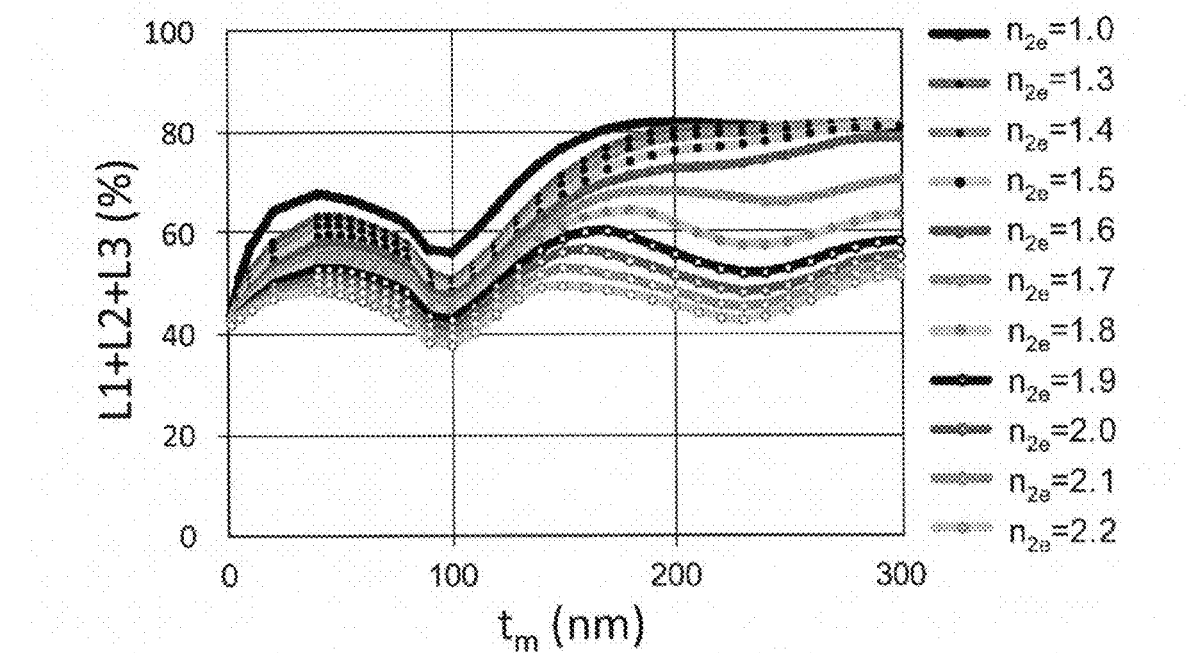

FIGS. 10A and 10B are graphs showing characteristics of the organic electroluminescence device according to the first modification of the first embodiment.

FIG. 10A and FIG. 10B show the case where the third functional layer 60 is provided.

In FIG. 10A and FIG. 10B, the horizontal axis represents the thickness (having units of nm) of the second organic layer 40.

The vertical axis of FIG. 10A represents the sum of the external mode component L1 and the substrate mode component L2 (L1+L2) (%) of the organic electroluminescence device 110 at the wavelength 525 nm of the light emitted from the first organic layer 30.

The vertical axis of FIG. 10B represents the sum of the external mode component L1, the substrate mode component L2, and the thin film layer mode component L3 (L1+L2+L3) (%) of the organic electroluminescence device 110 at the wavelength 525 nm of the light emitted from the first organic layer 30.

The configuration of the model for the characteristics shown in FIG. 10A and FIG. 10B differs from the configuration of the model for the characteristics shown in FIG. 5A and FIG. 5B for the following aspects. The third functional layer 60 is provided between the second organic layer 40 and the second electrode 20. The refractive index of the third functional layer 60 is 1.9. The thickness of the third functional layer 60 is 50 nm.

As shown in FIG. 10A and FIG. 10B, there is a trend that is similar to that of FIG. 5A and FIG. 5B even in the case where the third functional layer 60 is provided between the second organic layer 40 and the second electrode 20. In other words, there is a trend in which the light extraction efficiency of the components that can be extracted to the outside increases regardless of the thickness $t_m$ of the second organic layer 40 as at least the refractive index $n_{2e}$ of the second organic layer 40 in the thickness direction decreases.

Figure 11:
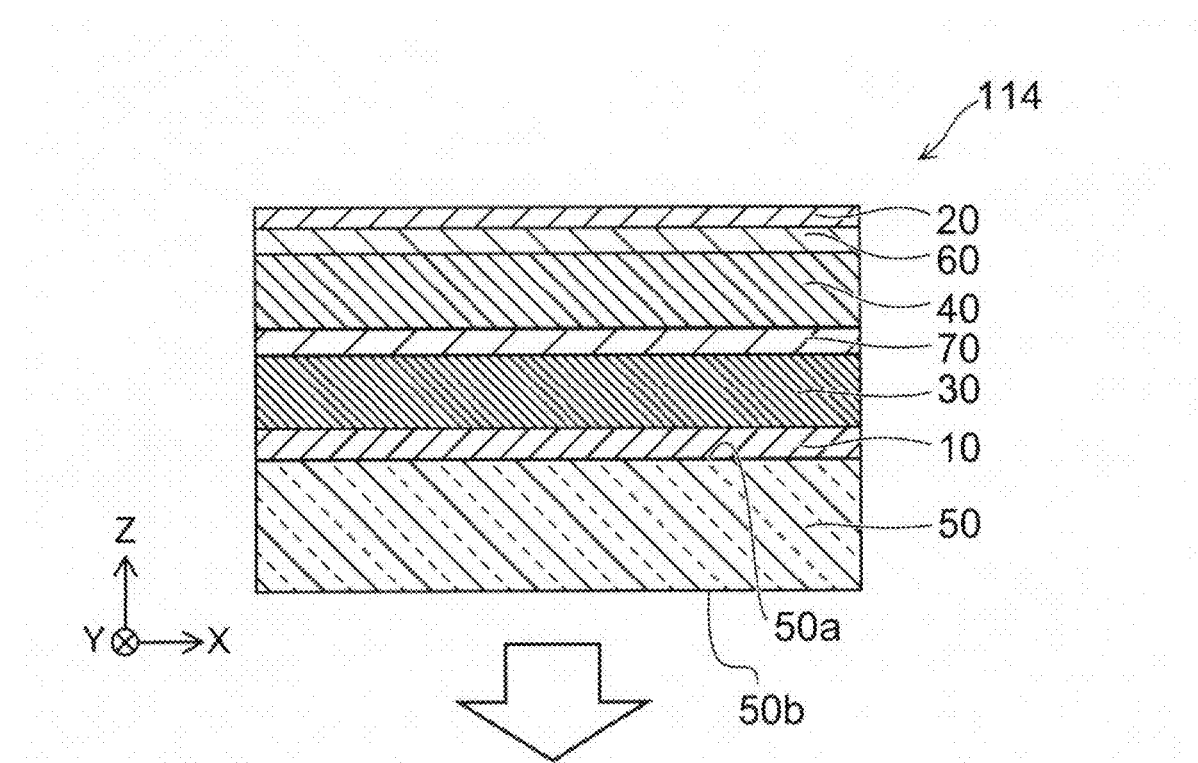
FIG. 11 is a schematic sectional view showing an organic electroluminescence device according to a second modification of the first embodiment.

FIG. 11 is a schematic sectional view showing an organic electroluminescence device according to a second modification of the first embodiment. The arrow shown in FIG. 11 indicates the main light extraction direction.

The organic electroluminescence device 114 according to the second modification of the first embodiment differs from the organic electroluminescence device 113 recited above in that the organic electroluminescence device 114 further includes a fourth functional layer 70. The aspects of the organic electroluminescence device 114 that differ from those of the organic electroluminescence device 113 will now be described.

The fourth functional layer 70 is provided between the first organic layer 30 and the second organic layer 40. The fourth functional layer 70 includes a material that is different from that of the second organic layer 40. For example, the fourth functional layer 70 is a layer that functions as a hole-blocking layer.

In the organic electroluminescence device 114 as well, there is a trend in which the light extraction efficiency of the components that can be extracted to the outside increases regardless of the thickness $t_m$ of the second organic layer 40 as at least the refractive index $n_{2e}$ of the second organic layer 40 in the thickness direction decreases.

In the organic electroluminescence device 113 and the organic electroluminescence device 114, a layer other than the second organic layer 40 may be provided between the first organic layer 30 and the second electrode 20.

Second Embodiment

Figure 12:
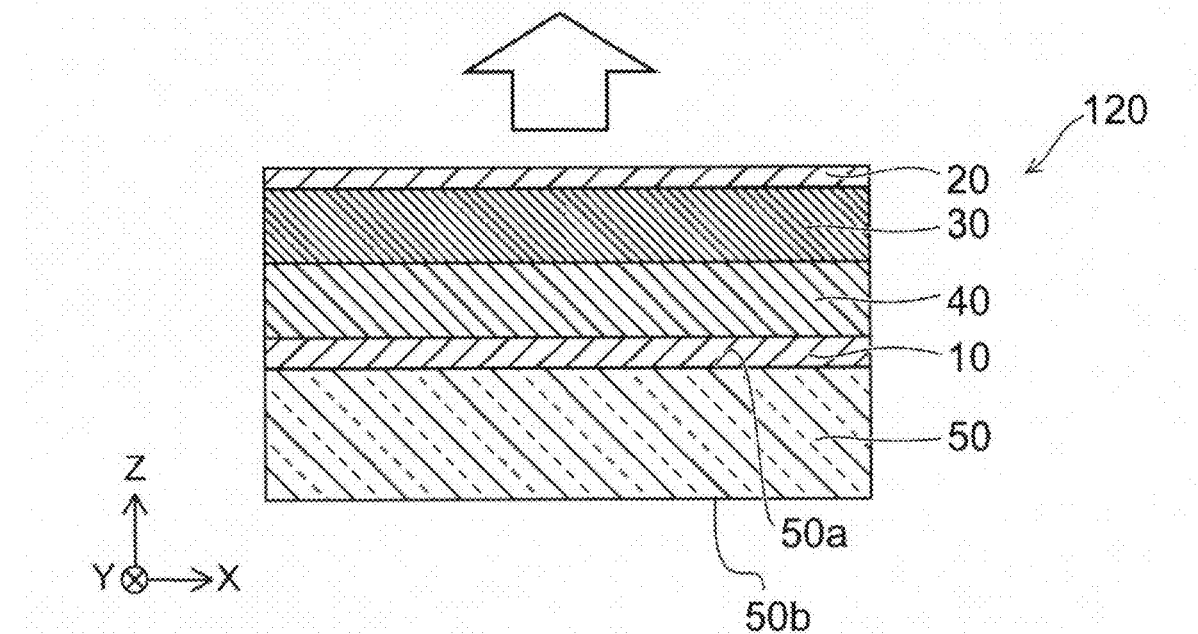
FIG. 12 is a schematic sectional view showing an organic electroluminescence device according to a second embodiment.

FIG. 12 is a schematic sectional view showing an organic electroluminescence device according to a second embodiment. The arrow shown in FIG. 12 indicates the main light extraction direction.

The organic electroluminescence device 120 according to the second embodiment differs from the organic electroluminescence device 110 recited above in that the organic electroluminescence device 120 is a so-called top-emission type. The aspects of the organic electroluminescence device 120 that differ from those of the organic electroluminescence device 110 will now be described.

In the organic electroluminescence device 120 of the embodiment as shown in FIG. 12, the substrate 50 is provided on the side of the first electrode 10 opposite to the second electrode 20. The intensity of the light from the first organic layer 30 that passes through the second electrode 20 is higher than the intensity of the light from the first organic layer 30 that passes through the substrate 50. The light emitted from the first organic layer 30 is extracted mainly from the second electrode 20 side.

For example, the first electrode 10 is provided on the first surface 50a of the substrate 50. The second organic layer 40 is provided on the first electrode 10. The first organic layer 30 is provided on the second organic layer 40. The second electrode 20 is provided on the first organic layer 30.

In this example, the first electrode 10 is the anode. The second electrode 20 is the cathode. The second organic layer 40 includes a hole transport material. Alternatively, the first electrode 10 is the cathode. The second electrode 20 is the anode. The second organic layer 40 includes an electron transport material.

In the so-called top-emission type organic electroluminescence device 120, at least the substrate mode component L2 is extracted as the external mode component L1. In the embodiment, the light extraction efficiency of the external mode component L1 increases because at least the refractive index $n_{2e}$ of the second organic layer 40 in the thickness direction is lower than the refractive index $n_1$ of the first organic layer 30.

Third Embodiment

Figure 13:
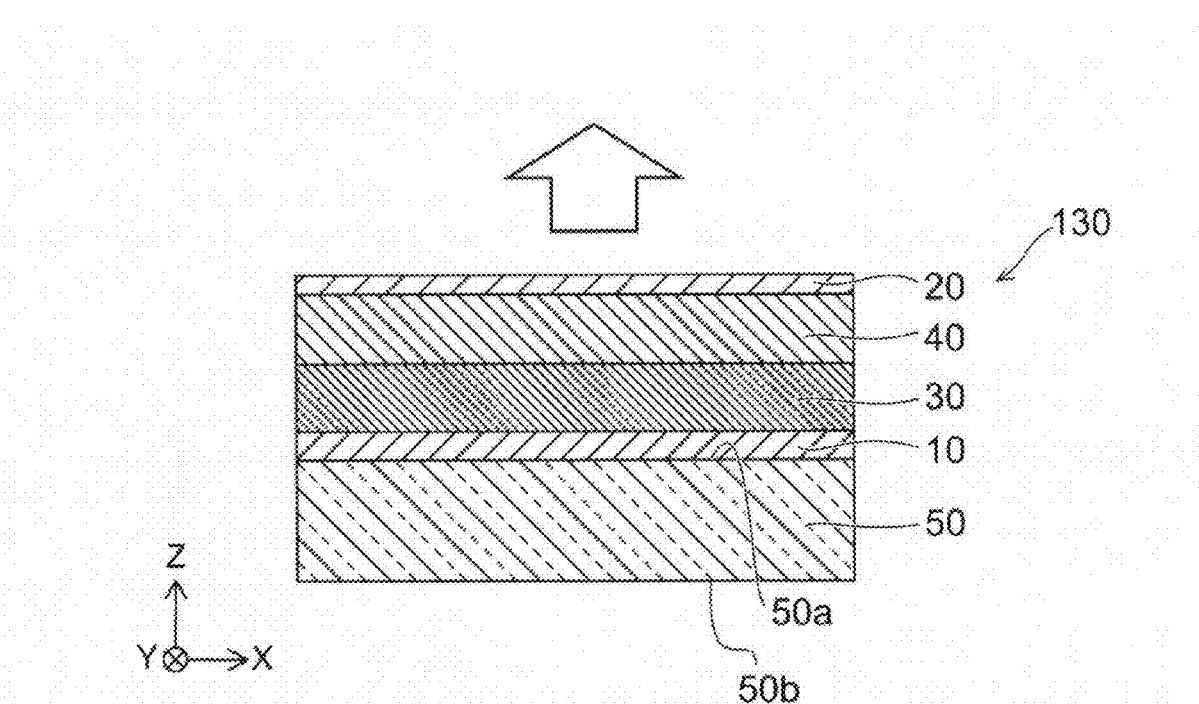
FIG. 13 is a schematic sectional view showing an organic electroluminescence device according to a third embodiment.

FIG. 13 is a schematic sectional view showing an organic electroluminescence device according to a third embodiment. The arrow shown in FIG. 13 indicates the main light extraction direction.

The thickness of the second electrode 20 of the organic electroluminescence device 130 according to the third embodiment differs from the thickness of the second electrode 20 of the organic electroluminescence device 110 according to the first embodiment. The aspects of the organic electroluminescence device 130 that differ from those of the organic electroluminescence device 110 will now be described.

As shown in FIG. 13, the first electrode 10 is provided on the first surface 50a of the substrate 50. The first organic layer 30 is provided on the first electrode 10. The second organic layer 40 is provided on the first organic layer 30. The second electrode 20 is provided on the second organic layer 40.

In this example, the first electrode 10 is the anode; and the second electrode 20 is the cathode. The second organic layer 40 includes a electron transport material.

For example, the second electrode 20 has a film thickness that is, for example, not more than 50 nm; and the second electrode 20 includes a metal. For example, the second electrode 20 is Mg:Ag. For example, the thickness of the second electrode 20 of the organic electroluminescence device 130 is thinner than the thickness of the second electrode 20 of the organic electroluminescence device 110.

The first electrode 10 may include a metal layer provided on the substrate 50, and a hole injection electrode provided on the metal layer. In such a case, for example, the metal layer includes Ag. For example, the hole injection electrode is ITO.

As in the third embodiment, the light extraction efficiency increases similarly to the first embodiment and the second embodiment even in the case where a thin metal layer is used as the cathode.

Fourth Embodiment

Figure 14:
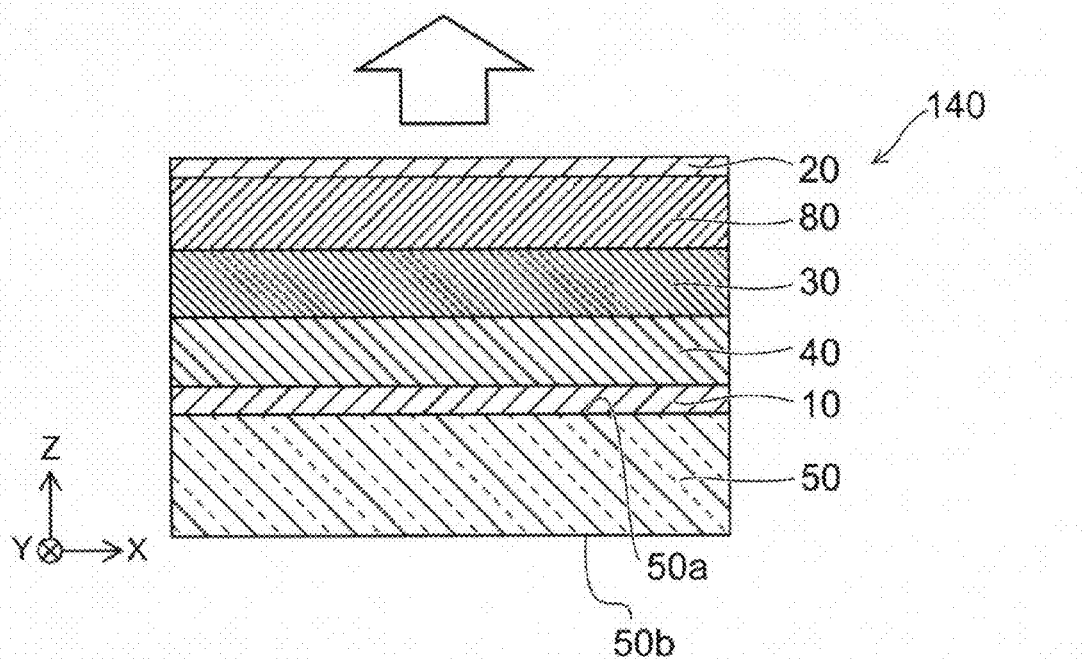
FIG. 14 is a schematic sectional view showing an organic electroluminescence device according to a fourth embodiment.

FIG. 14 is a schematic sectional view showing an organic electroluminescence device according to a fourth embodiment. The arrow shown in FIG. 14 indicates the main light extraction direction.

The organic electroluminescence device 140 according to the fourth embodiment differs from the organic electroluminescence device 120 according to the second embodiment in that the organic electroluminescence device 140 further includes a fifth functional layer 80. The aspects of the organic electroluminescence device 140 that differ from those of the organic electroluminescence device 120 will now be described.

As shown in FIG. 14, the fifth functional layer 80 is provided between the first organic layer 30 and the second electrode 20. The refractive index of the fifth functional layer 80 in the thickness direction is lower than the refractive index of the first organic layer 30.

In this example, the first electrode 10 is the anode. The second electrode 20 is the cathode. The first electrode 10 includes a metal. The second electrode 20 includes a metal. For example, the fifth functional layer 80 includes a electron transport material.

As in the fourth embodiment, the case may be considered where both the first electrode 10 and the second electrode 20 include metals. Non-propagating light loss may occur for the component from the first organic layer 30 toward the first electrode 10 and the component from the first organic layer 30 toward the second electrode 20. Accordingly, in the case where the refractive index of the second organic layer 40 in the thickness direction and the refractive index of the fifth organic layer 80 in the thickness direction satisfy the relationship recited above, the light extraction efficiency of the components that can be extracted to the outside increases.

In the embodiment, the first electrode 10 may be the cathode; and the second electrode 20 may be the anode.

Fifth Embodiment

Figure 15:
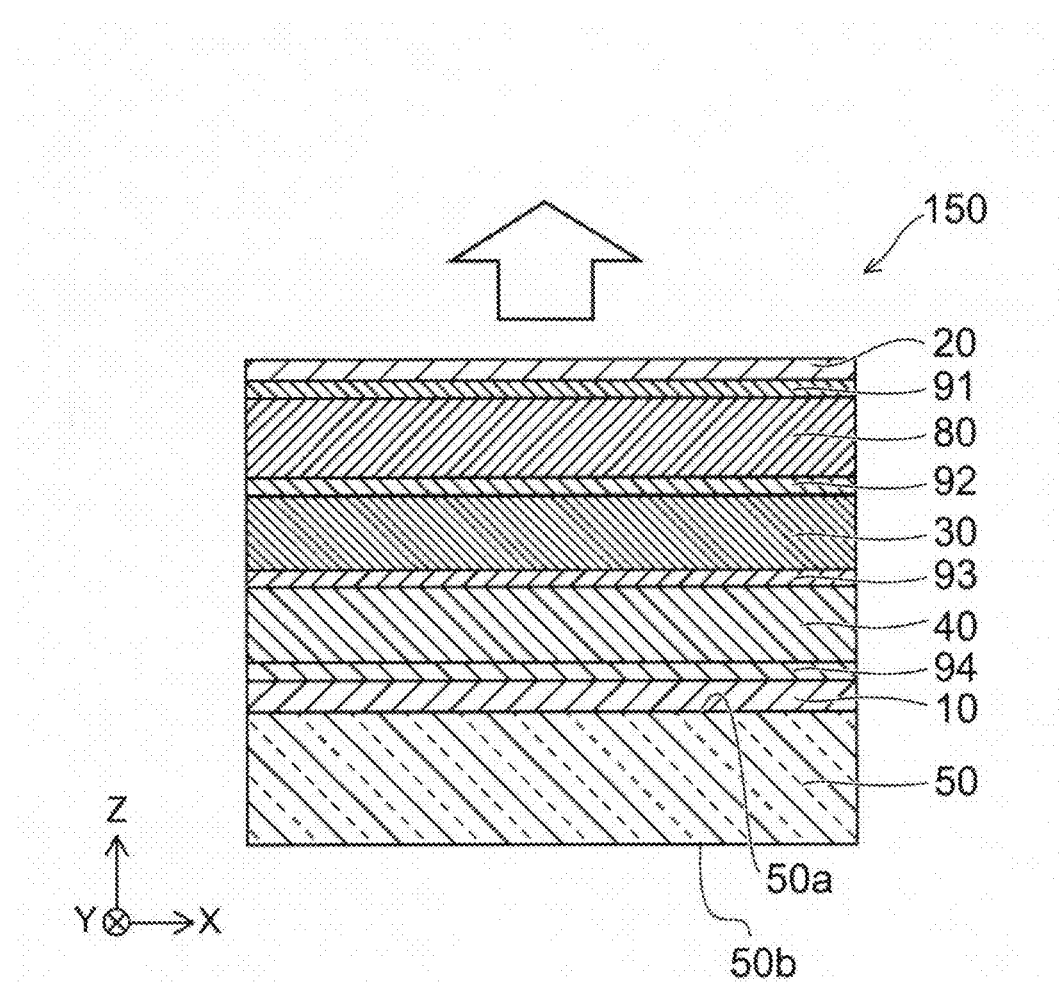
FIG. 15 is a schematic sectional view showing an organic electroluminescence device according to a fifth embodiment.

FIG. 15 is a schematic sectional view showing an organic electroluminescence device according to a fifth embodiment. The arrow shown in FIG. 15 indicates the main light extraction direction.

The organic electroluminescence device 150 according to the fifth embodiment differs from the organic electroluminescence device 140 according to the fourth embodiment in that the first intermediate layer 91, etc., are provided between the first electrode 10 and the second electrode 20. The aspects of the organic electroluminescence device 150 that differ from those of the organic electroluminescence device 140 will now be described.

As shown in FIG. 15, for example, the first intermediate layer 91 is provided between the second electrode 20 and the fifth functional layer 80. A second intermediate layer 92 is provided between the fifth functional layer 80 and the first organic layer 30. A third intermediate layer 93 is provided between the first organic layer 30 and the second organic layer 40. A fourth intermediate layer 94 is provided between the second organic layer 40 and the first electrode 10.

For example, the first intermediate layer 91, the second intermediate layer 92, the third intermediate layer 93, and the fourth intermediate layer 94 all include materials that are different from those of the second organic layer 40 and the fifth functional layer 80. For example, the first intermediate layer 91 includes an electron injection material. The second intermediate layer 92 includes a hole blocking material. The third intermediate layer 93 includes an electron blocking material. The fourth intermediate layer 94 includes a hole injection material.

Even in the case where the organic electroluminescence device 150 includes multiple intermediate layers as in the fifth embodiment, the light extraction efficiency of the components that can be extracted to the outside increases in the case where the refractive index of the second organic layer 40 in the thickness direction and the refractive index of the fifth functional layer 80 in the thickness direction satisfy the relationship recited above.

Sixth Embodiment

Figure 16A:
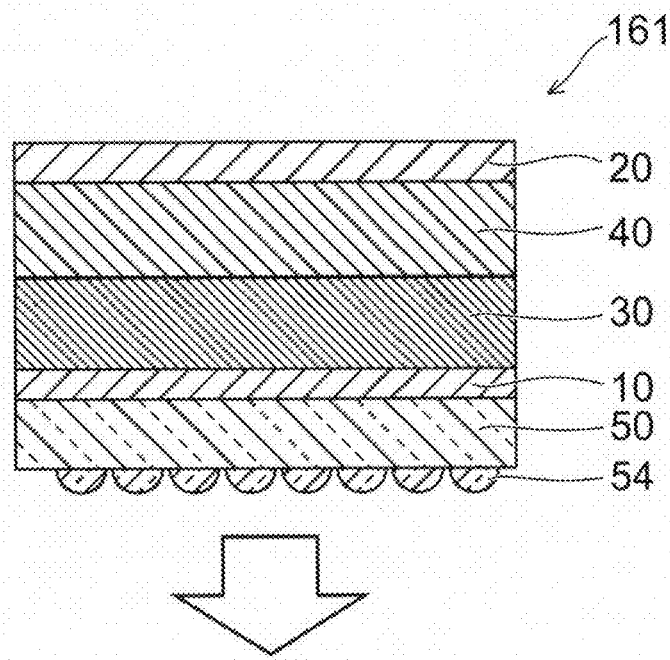
FIG. 16A and FIG. 16B are schematic views showing an organic electroluminescence device according to a sixth embodiment.
Figure 16B:
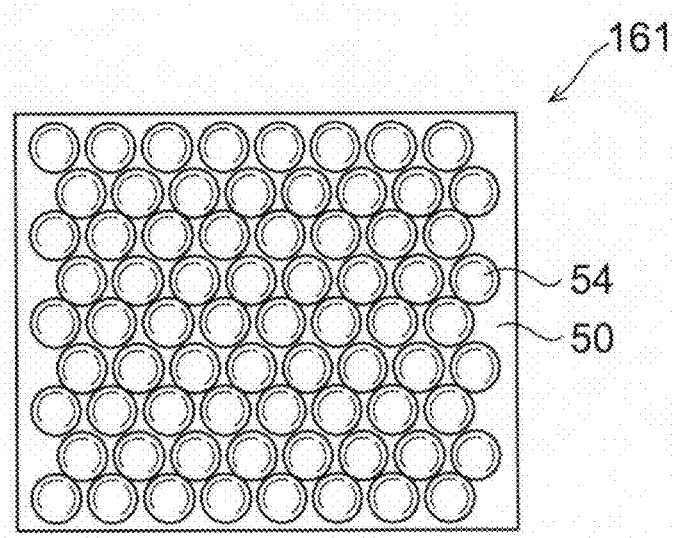

FIG. 16A and FIG. 16B are schematic views showing an organic electroluminescence device according to a sixth embodiment. The arrow shown in FIG. 16A indicates the main light extraction direction.

The organic electroluminescence device 161 according to the sixth embodiment differs from the organic electroluminescence device 110 according to the first embodiment in that the optical path conversion unit 54 is provided. The aspects of the organic electroluminescence device 161 that differ from those of the organic electroluminescence device 110 will now be described.

As shown in FIG. 16A, the substrate 50 is provided. The substrate 50 includes the optical path conversion unit 54. The refractive indexes of the substrate 50 and the optical path conversion unit 54 are selected from 1.4 or more and 2.2 or less. The optical path conversion unit 54 is provided on the side of the substrate 50 opposite to the second electrode 20. The optical path conversion unit 54 changes the direction of the component of the light from the first organic layer 30 toward the first electrode 10. Thereby, the substrate mode component L2 is extracted to the outside without undergoing a total reflection.

In this example, the optical path conversion unit 54 is a so-called microlens. For example, the optical path conversion unit 54 includes a resin. For example, the optical path conversion unit 54 is formed by a die. The optical path conversion unit 54 may be formed by inkjet. The optical path conversion unit 54 may be formed of a film.

As shown in FIG. 16B, the optical path conversion unit 54 has a circular configuration as viewed in the Z-axis direction. For example, the diameter of the optical path conversion unit 54 is not less than 5 μm and not more than 100 μm.

The optical path conversion unit 54 is multiply provided. The multiple optical path conversion units 54 have a hexagonal configuration. Or, the multiple optical path conversion units 54 have a tetragonal lattice arrangement. For example, the packing factor of the multiple optical path conversion units 54 is not less than 30% and not more than 91%.

In this example, the light extraction efficiency of the organic electroluminescence device 161 increases due to the substrate mode component L2 being extracted to the outside by the optical path conversion unit 54.

Modifications of the sixth embodiment will now be described.

FIG. 17A to FIG. 20 are schematic views showing organic electroluminescence devices according to modifications of the sixth embodiment.

Figure 17A:
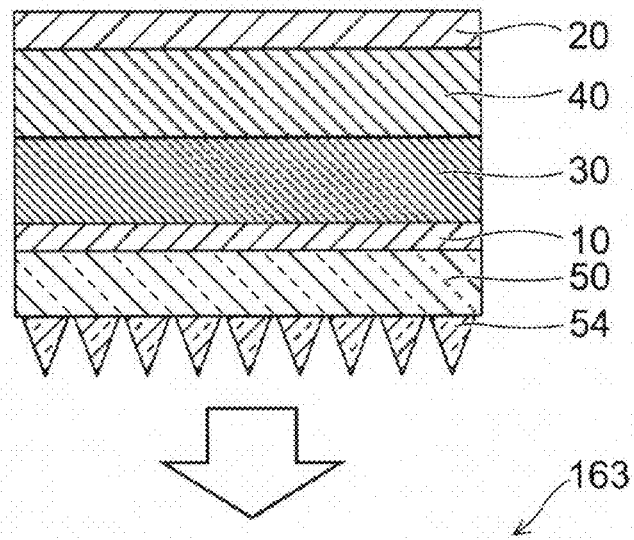
FIG. 17A to FIG. 20 are schematic views showing organic electroluminescence devices according to modifications of the sixth embodiment.
Figure 17B:
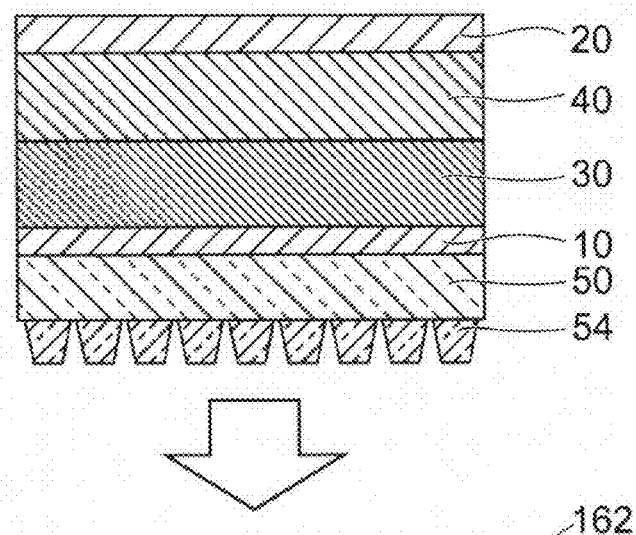

FIG. 17A shows an organic electroluminescence device 162 according to a first modification of the sixth embodiment. FIG. 17B shows an organic electroluminescence device 163 according to a second modification of the sixth embodiment. The arrows shown in FIG. 17A and FIG. 17B indicate the main light extraction direction.

In the organic electroluminescence device 162 according to the first modification of the sixth embodiment as shown in FIG. 17A, the optical path conversion unit 54 has, for example, a quadrilateral pyramid configuration.

In the organic electroluminescence device 163 according to the second modification of the sixth embodiment as shown in FIG. 17B, the optical path conversion unit 54 has, for example, a truncated quadrilateral pyramid configuration.

Figure 17C:
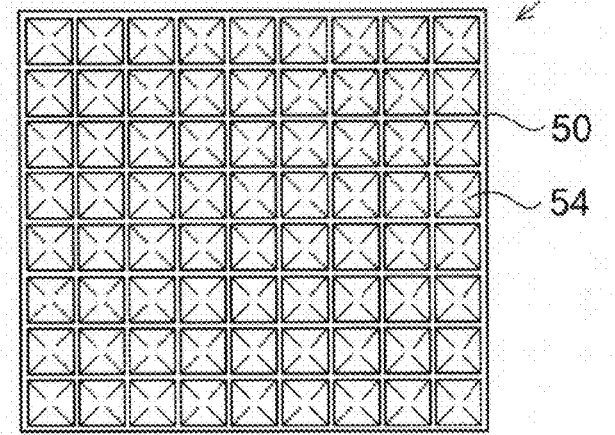

In the organic electroluminescence device 162 according to the first modification of the sixth embodiment and the organic electroluminescence device 163 according to the second modification of the sixth embodiment as shown in FIG. 17C, the optical path conversion unit 54 has a rectangular configuration as viewed from the Z-axis direction. For example, the length of one side on the first electrode 10 side of the optical path conversion unit 54 is not less than 5 μm and not more than 100 μm. For example, the length of one side on the light extraction side of the optical path conversion unit 54 is not less than 2.5 μm and not more than 50 μm. The height of the optical path conversion unit 54 is, for example, not less than 5 μm and not more than 100 μm.

The optical path conversion unit 54 is multiply provided. Multiple optical path conversion units 54 are disposed in a lattice configuration as viewed in the Z-axis direction.

In this example, the light extraction efficiency of the organic electroluminescence devices 162 and 163 increases due to the substrate mode component L2 being extracted to the outside by the optical path conversion unit 54.

Figure 18A:
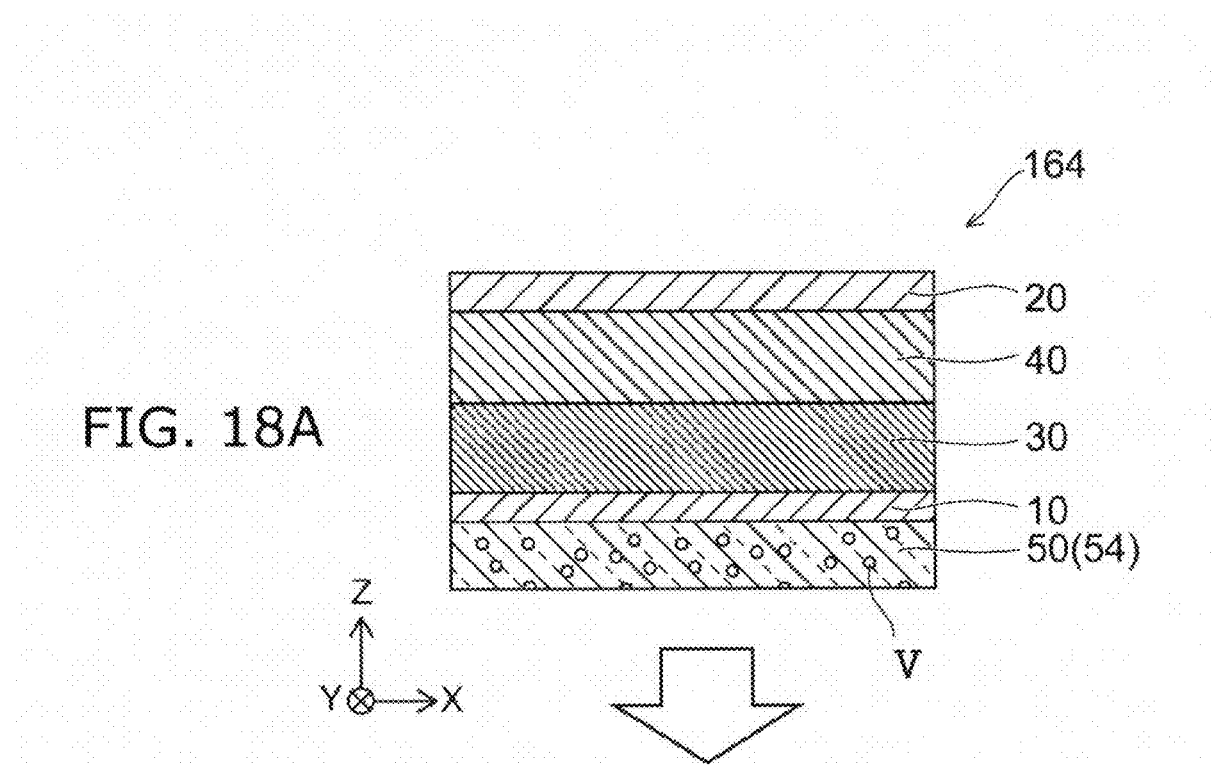
Figure 18B:
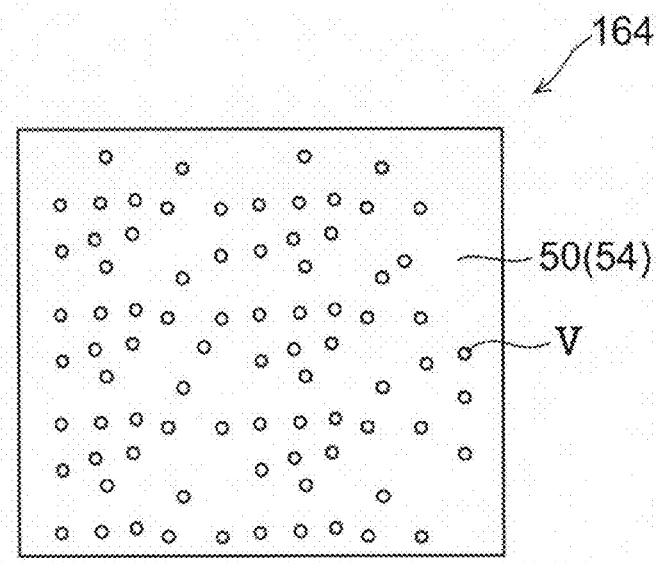

FIG. 18A and FIG. 18B show an organic electroluminescence device 164 according to a third modification of the sixth embodiment. The arrow shown in FIG. 18A indicates the main light extraction direction.

As shown in FIG. 18A and FIG. 18B, the optical path conversion unit 54 includes the substrate 50 and structure bodies V. The optical path conversion unit 54 has multiple structure bodies V converting the optical path through scattering or refraction. The multiple voids V may overlay each other as viewed in the Z-axis direction. The optical path conversion unit 54 may be provided as the substrate 50. The structure bodies V may be voids.

In this example, the light extraction efficiency of the organic electroluminescence device 164 increases due to the substrate mode component L2 being extracted to the outside by the optical path conversion unit 54.

Figure 19A:
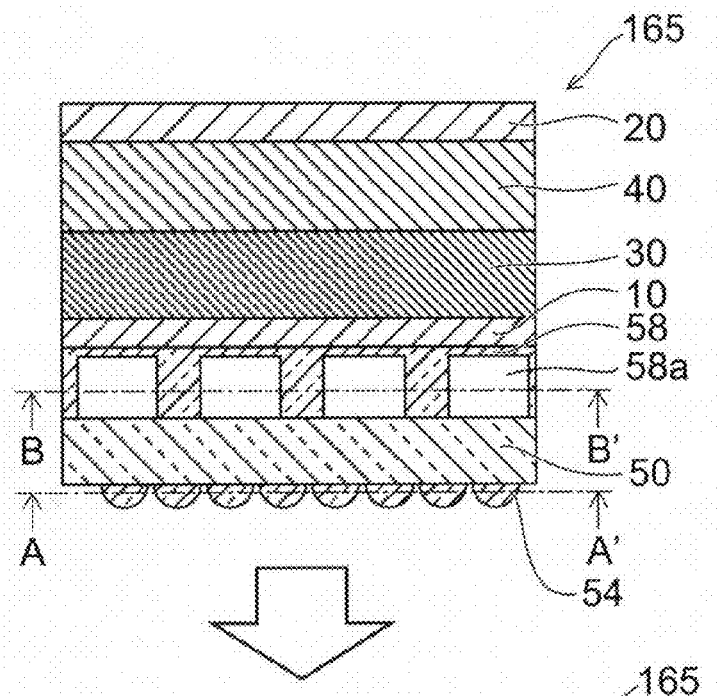
Figure 19B:
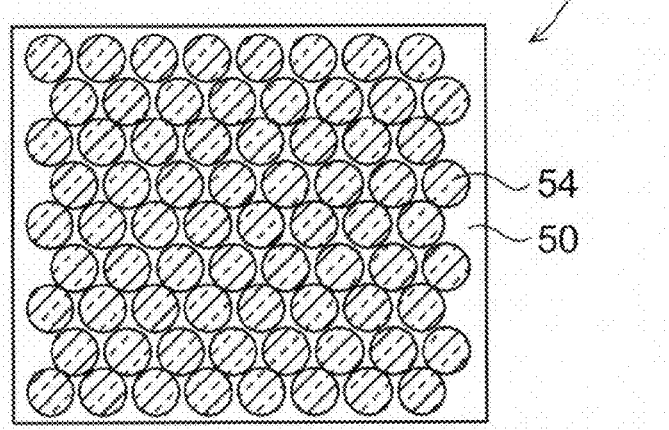
Figure 19C:
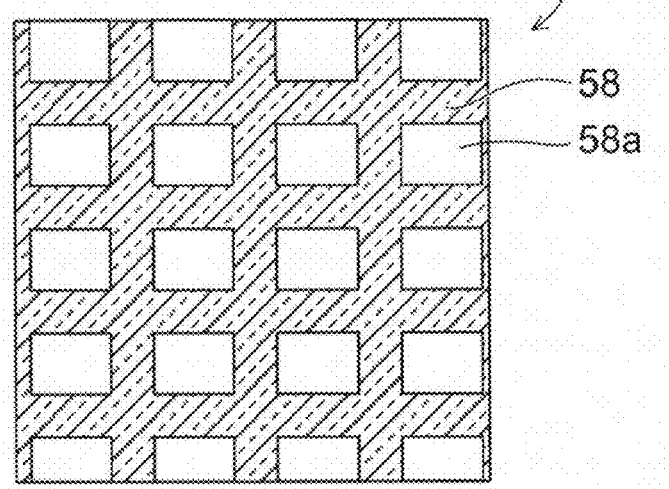

FIG. 19A to FIG. 19C show an organic electroluminescence device 165 according to a fourth modification of the sixth embodiment. The arrow shown in FIG. 19A indicates the main light extraction direction.

As shown in FIG. 19A and FIG. 19B, the organic electroluminescence device 165 may further include an optical layer 58. The optical layer 58 is provided between the substrate 50 and the first electrode 10. The refractive index of the optical layer 58 is approximately the same as the refraction index of the first electrode 10, the first organic layer 30 and the second organic layer 40, for example, not less than 1.8 and not more than 2.0. The optical layer 58 includes a low refractive index layer 58a. The low refractive index layer 58a may be contacted with the substrate 50 or the first electrode 10. The refractive index of the low refractive index layer 58a is lower than the refractive index of the optical layer 58. The refractive index of the low refractive index layer 58a is selected, for example, not less than 1.0 and not more than 1.5. The low refractive index layer 58a is, for example, voids provided in the optical layer 58.

In this example, the light extraction efficiency of the organic electroluminescence device 165 increases due to the thin film mode component L3 being extracted to the outside by the optical path conversion unit 54.

Figure 20:
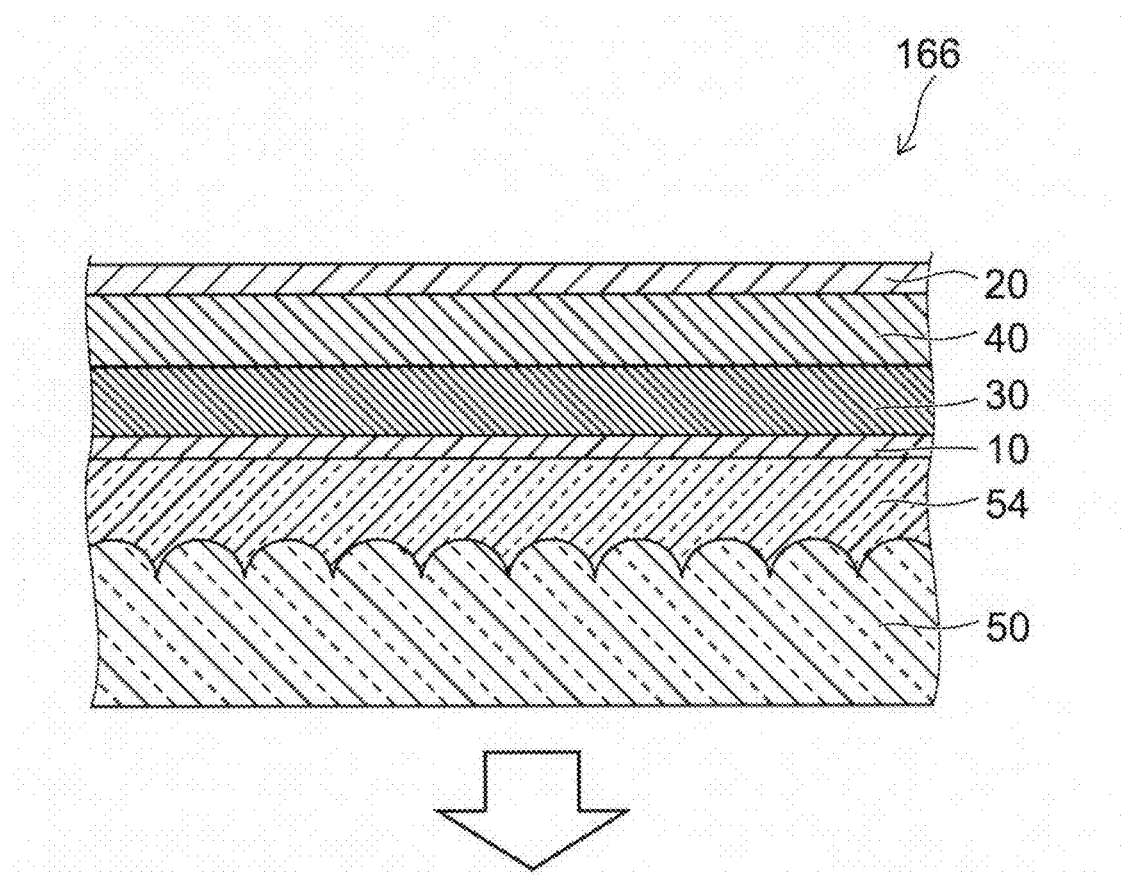

FIG. 20 shows an organic electroluminescence device 166 according to a fifth modification of the sixth embodiment. The arrow shown in FIG. 20 indicates the main light extraction direction.

As shown in FIG. 20, the first electrode 10 is provided between the first organic layer 30 and the optical path conversion unit 54. The interface between the optical path conversion unit 54 and the substrate 50 has a concavity and convexity configuration.

In this example, the light extraction efficiency of the organic electroluminescence device 166 increases due to the thin film layer mode component L3 being extracted to the outside by the optical path conversion unit 54.

Thus, according to the sixth embodiment, the optical path conversion unit 54 further increases the light extraction efficiencies of the organic electroluminescence devices 161 to 166 further increases.

According to the embodiments recited above, a display apparatus having a higher light extraction efficiency is provided.

Hereinabove, exemplary embodiments of the invention are described with reference to specific examples.

However, the invention is not limited to these specific examples. For example, the third functional layer 60, the functional layer 70, the functional layer 80, the first intermediate layer 91, the second intermediate layer 92 and the third intermediate layer 93 may include an inorganic layer. For example, in the case of functioning as an electron injection layer, LiF, CsF, an elemental substance of alkaline metal, an elemental substance of alkaline earth metal or the like may be included. In the case of functioning as a hole injection layer, $MoO_3$ or the like may be included. One skilled in the art may similarly practice the invention by appropriately selecting specific configurations of components included in the display device from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all display devices practicable by an appropriate design modification by one skilled in the art based on the display device described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescence device, comprising:
a first electrode;
a second electrode including a metal;
a first organic layer provided between the first electrode and the second electrode; and
a second organic layer provided between the first organic layer and the second electrode,
the first organic layer being configured to emit light by a current passed through the second organic layer,
a refractive index of the second organic layer in a thickness direction for the light being lower than a refractive index of the first organic layer for the light,
the refractive index of the second organic layer in the thickness direction for the light being lower than a refractive index of the second organic layer in a direction perpendicular to the thickness direction for the light.

2. The device according to claim 1, wherein
a thickness of the second organic layer is not less than 1 nanometer and not more than 200 nanometers.

3. The device according to claim 2, wherein
a thickness of the second organic layer is not more than 100 nanometers.

4. The device according to claim 1, further comprising a first functional layer provided between the second organic layer and the second electrode, the first functional layer including a material different from a material of the second organic layer.

5. The device according to claim 4, wherein
the first functional layer includes an inorganic material.

6. The device according to claim 1, further comprising a second functional layer provided between the first organic layer and the second organic layer, the second functional layer including a material different from a material of the second organic layer.

7. The device according to claim 6, wherein
the second functional layer includes an inorganic material.

8. The device according to claim 1, further comprising a substrate provided on a side of the first electrode opposite to the second electrode,
an intensity of the light from the first organic layer passing through the substrate being higher than an intensity of the light from the first organic layer passing through the second electrode.

9. The device according to claim 8, wherein
the second organic layer includes an electron transport material.

10. The device according to claim 8, wherein
the substrate includes an optical path conversion unit,
the optical path conversion unit is provided on a side of the substrate opposite to the second electrode to change a direction of a component of the light traveling toward the first electrode from the first organic layer.

11. The device according to claim 10, further comprising:
an optical layer provided between the substrate and the first electrode,
the optical layer being in contact with the substrate and the first electrode and including a high refractive index layer having a refractive index higher than a refractive index of the substrate.

12. The device according to claim 8, wherein
the substrate includes an optical path conversion unit,
the optical path conversion unit is configured to change a direction of a component of the light traveling toward the first electrode from the first organic layer,
the first electrode is provided between the first organic layer and the optical path conversion unit.

13. The device according to claim 1, further comprising a substrate provided on a side of the first electrode opposite to the second electrode,
an intensity of the light from the first organic layer passing through the second electrode being higher than an intensity of the light from the first organic layer passing through the substrate.

14. The device according to claim 13, further comprising a third functional layer provided between the first organic layer and the first electrode,
a refractive index of the third functional layer in the thickness direction for the light being lower than the refractive index of the first organic layer for the light.

15. The device according to claim 14, wherein
the third functional layer includes an inorganic material.

16. The device according to claim 1, wherein
a film thickness of the second electrode is not more than 50 nanometers, the second electrode including the metal.

17. The device according to claim 1, wherein
the light has a first wavelength band not less than 400 nanometers and not more than 800 nanometers, and
at least a refractive index of the second organic layer in the thickness direction for the first wavelength band is lower than a refractive index of the first organic layer for the first wavelength band.

18. The device according to claim 1, wherein
at least the refractive index of the second organic layer in the thickness direction for a peak wavelength at which a light emission from the first organic layer is at a peak is lower than the refractive index of the first organic layer for the peak wavelength.

* * * * *